(12) United States Patent
Inomata

(10) Patent No.: US 8,179,624 B2
(45) Date of Patent: May 15, 2012

(54) METHOD AND APPARATUS FOR EVALUATING A MAGNETIC RECORDING MEDIUM

(75) Inventor: Akihiro Inomata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 852 days.

(21) Appl. No.: 11/975,348

(22) Filed: Oct. 18, 2007

(65) Prior Publication Data
US 2008/0094744 A1    Apr. 24, 2008

(30) Foreign Application Priority Data
Oct. 19, 2006  (JP) .................... 2006-285344

(51) Int. Cl.
*G11B 5/02*  (2006.01)
*G11B 5/09*  (2006.01)
(52) U.S. Cl. ................ 360/25; 360/53; 360/59
(58) Field of Classification Search .......... None
See application file for complete search history.

(56) References Cited

U.S. PATENT DOCUMENTS

| | | | | |
|---|---|---|---|---|
| 6,469,960 | B1 * | 10/2002 | Miyoshi | 369/13.14 |
| 6,515,814 | B1 * | 2/2003 | Hamamoto et al. | 360/59 |
| 2001/0021076 | A1 * | 9/2001 | Kojima et al. | 360/59 |

FOREIGN PATENT DOCUMENTS

JP  2005-222669  8/2005

OTHER PUBLICATIONS

Daibo, M.; "Laser SQUID Microscope for Semiconductor Testing;" Journal of the Magnetic Society of Japan, 29, No. 1, 14-19 (2005).
van Kempen et al.; "All-Optical Probe of Coherent Spin Waves;" Physical Review Letters, 88, No. 22, 227201-1-227201-4 (2002.
Back et al; "Magnetization Reversal in Ultrashort Magnetic Field Pulses;" Physical review Letters, 81, No. 15, 3251-3254 (1998).

* cited by examiner

*Primary Examiner* — Daniell L Negron
(74) *Attorney, Agent, or Firm* — Fujitsu Patent Center

(57) ABSTRACT

A method of evaluating a magnetic recording medium using a magnetic head having a reproduction element is disclosed The method includes the steps of (a) recording a signal in a predetermined area of the magnetic recording medium; (b) determining a first value of a reproduction output by reproducing the predetermined area of the magnetic recording medium; (c) determining a second value of the reproduction output by emitting an energy line having a power of a predetermined value onto the predetermined area and reproducing the predetermined area with the reproduction element during or after the emission of the energy line; and (d) calculating a change in the reproduction output due to the emission of the energy line based on the first value and the second value of the reproduction output.

21 Claims, 16 Drawing Sheets

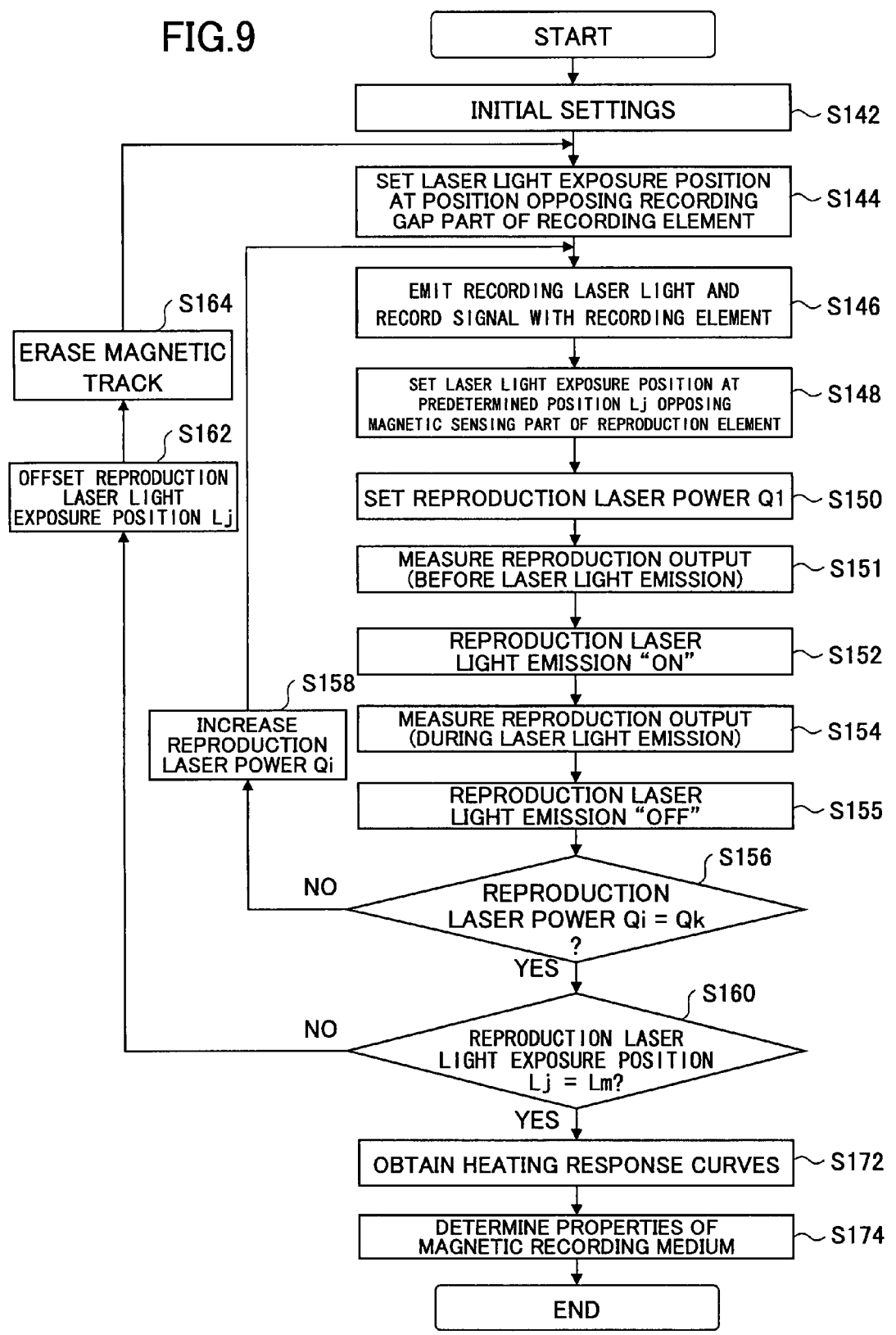

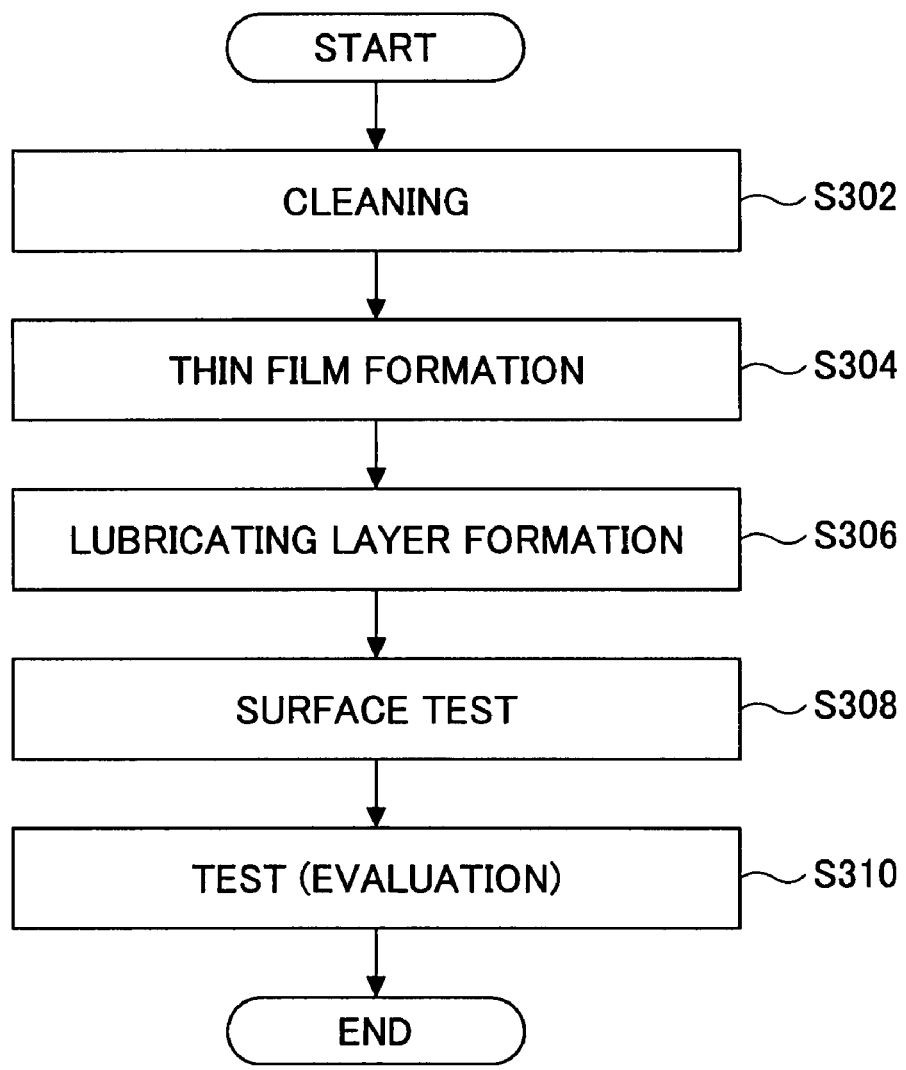

METHOD AND APPARATUS FOR EVALUATING A MAGNETIC RECORDING MEDIUM

CROSS-REFERENCE TO RELATED APPLICATION

The present application is based on Japanese Priority Patent Application No. 2006-285344, filed on Oct. 19, 2006, the entire contents of which are hereby incorporated by reference.

BACKGROUND OF THE INVENTION

1. Field of the Invention

The present invention relates to a method and apparatus for evaluating a magnetic recording medium.

2. Description of the Related Art

Increasing recording densities of magnetic storage devices have caused the problem of so-called thermal stability of residual magnetization, or a decrease over time in the magnetization of bits recorded in a recording layer. Ferromagnetic materials with increased anisotropic magnetic field strength have been used for recording layers in order to increase the thermal stability of residual magnetization. This results in an increase in the recording magnetic field necessary for reversing the direction of the magnetization of the recording layer. However, increases in the maximum recording magnetic field that a magnetic head can generate have not kept up, so that the recording magnetic field may not be sufficient for recording.

In order to solve this problem, thermally assisted magnetic recording is proposed. (See, for example, Patent Document 1 listed below.) According to the thermally assisted magnetic recording, at the time of recording, a magnetic recording medium is heated by exposing the magnetic recording medium to laser light so as to reduce reversal magnetic field strength, thereby facilitating recording. According to the thermally assisted magnetic recording, the magnetization of the recording layer is reversed at high speed on the order of a nanosecond with the recording layer being exposed to laser light, and it is necessary to design a medium that is best suited to the conditions and magnetization behavior of the recording layer.

According to the thermally assisted magnetic recording, however, the temperature rises to 100° C. to several hundred ° C. in an extremely short time, so that it is extremely difficult to evaluate the magnetic properties of the magnetic recording medium. Further, it is necessary to observe an area of the magnetic recording medium that is less than or equal to approximately 100 nm on a side.

The magnetization condition at the time of laser light exposure is measured using a so-called laser SQUID (Superconducting Quantum Interference Device) microscope. (See, for example, Non-Patent Document 1 listed below.)

Further, high-speed magnetization reversal is measured by, for example, exposing a sample disposed in a magnetic field to laser light of an extremely short duration (Non-Patent Document 2 listed below), applying a magnetic field of an extremely short duration to a sample and measuring magnetic reversal using the Kerr effect (Non-Patent Document 3), or using an electron beam.

[Patent Document 1] Japanese Laid-Open Patent Application No. 2005-222669

[Non-Patent Document 1] Daibo, M.; "Laser SQUID Microscope for Semiconductor Testing," *Journal of the Magnetics Society of Japan*, 29, No. 1, 14-19 (2005)

[Non-Patent Document 2] van Kempen, M. et al.; "All-Optical Probe of Coherent Spin Waves," *Physical Review Letters*, 88, No. 22, 227201-1-227201-4 (2002)

[Non-Patent Document 3] Back, C. H. et al.; "Magnetization Reversal in Ultrashort Magnetic Field Pulses," *Physical Review Letters*, 81, No. 15, 3251-3254 (1998)

However, according to Non-Patent Document 1, there are problems in that it is difficult to detect fine magnetization behavior because the resolution of the laser SQUID microscope is as large as approximately several μm and that a large amount of money is required for equipment such as a large-scale cooling system in order to measure a large number of magnetic recording media.

Further, according to Non-Patent Document 2 or 3 or a measurement method using an electron beam, there is a problem in that it is difficult to measure a large number of magnetic recording media in a simple manner because the main purpose is to observe high-speed reversal of magnetization, which requires an expensive and large-scale system. Further, introduction of such a system as a testing device into the process of manufacturing magnetic recording media is difficult in terms of costs.

SUMMARY OF THE INVENTION

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) determining a second value of the reproduction output by emitting an energy line having a power of a predetermined value onto the predetermined area and reproducing the predetermined area with the reproduction element during or after the emission of the energy line; and (d) calculating a change in the reproduction output due to the emission of the energy line based on the first value and the second value of the reproduction output.

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) determining a second value of the reproduction output by reproducing the predetermined area with the reproduction element while emitting an energy line having a power of a predetermined value onto the predetermined area; (d) calculating an output reduction rate during the emission of the energy line with respect to the reproduction output before the emission of the energy line based on the first value and the second value of the reproduction output; and (e) determining a property of the magnetic recording medium based on the output reduction rate during the emission of the energy line.

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) emitting an energy line having a power of a predetermined value onto the predetermined area, and determining a second value of the reproduction output by reproducing the predetermined area with the reproduction element after the emission of the energy line; (d) calculating an output reduction rate after the emission of the energy line with respect to the reproduction output before the emission of the energy line based on the first value and the second value of the reproduction output; and (e) determining a property of the magnetic recording medium based on the output reduction rate after the emission of the energy line.

According to one aspect of the present invention, there is provided a method of evaluating a magnetic recording medium using a magnetic head having a reproduction element, the method including the steps of (a) recording a signal in a predetermined area of the magnetic recording medium; (b) setting an exposure position to be exposed to an energy line at a predetermined position with respect to a magnetic sensing part position in a recording layer of the magnetic recording medium, the magnetic sensing part position opposing a magnetic sensing part of the reproduction element, emitting the energy line having a power of a predetermined value, and determining a reproduction output by reproducing the predetermined area of the recording layer in which the signal is recorded with the reproduction element during the emission of the energy line; (c) changing the exposure position and repeating steps (a) and (b); and (d) determining a property of the magnetic recording medium based on a relationship between the reproduction outputs and the exposure positions.

According to one aspect of the present invention, there is provided an apparatus for evaluating a magnetic recording medium having a recording layer, the apparatus including a magnetic head having a reproduction element configured to detect a signal magnetic field with a magnetic sensing part; a positioning part configured to position the magnetic head; a heating part configured to heat the recording layer in which a signal is recorded by emitting an energy line onto the recording layer, the heating part being capable of determining a position to be heated; a reproduction part configured to obtain a reproduced signal by detecting the signal magnetic field from the recording layer with the magnetic sensing part with a part of the recording layer opposing the magnetic sensing part being heated to a predetermined temperature with the heating part, and to determine a reproduction output from the reproduced signal; and an operation part configured to determine a property of the magnetic recording medium based on the reproduction output, wherein the reproduction part determines the reproduction output with or after a part of the recording layer opposing the magnetic sensing part being heated to a predetermined temperature with the heating part, and the operation part determines the property of the magnetic recording medium based on a change in the reproduction output.

BRIEF DESCRIPTION OF THE DRAWINGS

Other objects, features and advantages of the present invention will become more apparent from the following detailed description when read in conjunction with the accompanying drawings, in which:

FIG. 9 is a flowchart of a method of evaluating a magnetic recording medium according to a third embodiment of the present invention;

FIG. 16 is a flowchart of a method of manufacturing a magnetic recording medium according to a fifth embodiment of the present invention.

DETAILED DESCRIPTION OF THE PREFERRED EMBODIMENTS

A description is given, with reference to the accompanying drawings, of embodiments of the present invention.

[First Embodiment]

Figure 1:
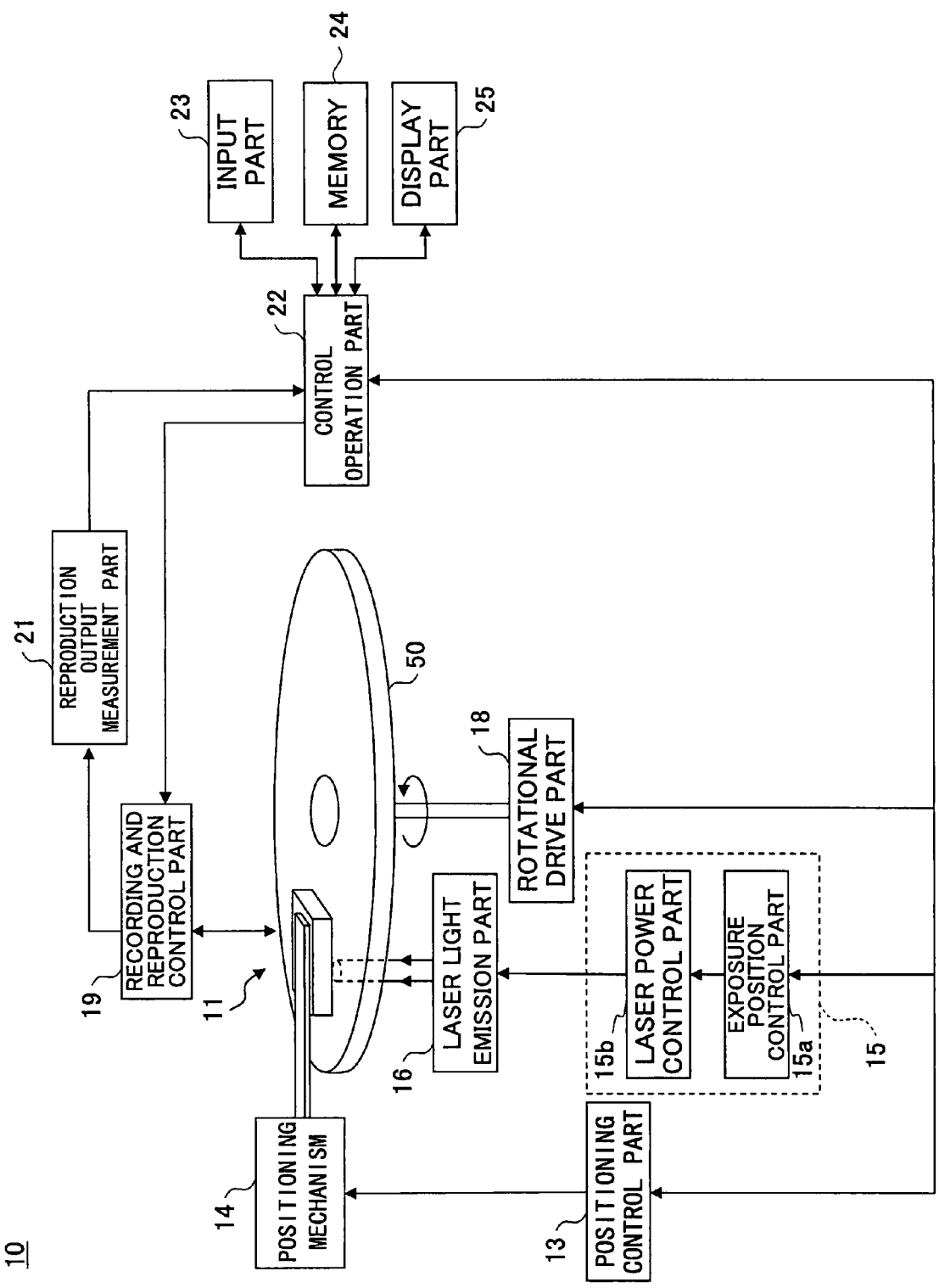
FIG. 1 is a schematic diagram showing an evaluation apparatus for evaluating a magnetic recording medium according to a first embodiment of the present invention.

FIG. 1 is a schematic diagram showing an evaluation apparatus 10 for evaluating a magnetic recording medium according to a first embodiment of the present invention.

Referring to FIG. 1, the evaluation apparatus 10 includes a magnetic recording medium 50 to be evaluated, a magnetic head 11, a positioning mechanism 14 of the magnetic head 11, a positioning control part 13 configured to control the positioning mechanism 14, a laser light emission part 16 configured to emit laser light onto the magnetic recording medium 50, an emission control part 15 configured to control the laser light emission part 16, a recording and reproduction control part 19 configured to control the recording (write) and reproduction (read) operations of the magnetic head 11, a reproduction output measurement part 21 configured to calculate reproduction output from a reproduced signal, a rotational drive part 18 configured to rotate the magnetic recording medium 50, a control operation part 22 configured to control the entire evaluation apparatus 10, an input part 23 of the control operation part 22, a memory 24, and a display part 25.

The evaluation apparatus 10 operates in accordance with a program stored in the memory 24 or a command input from the input part 23, and evaluates the magnetic recording medium 50. The program causes the evaluation apparatus 10 to execute the steps of flowcharts shown in FIG. 4, FIG. 9 (third embodiment), and FIG. 15 (fourth embodiment).

Figure 2:
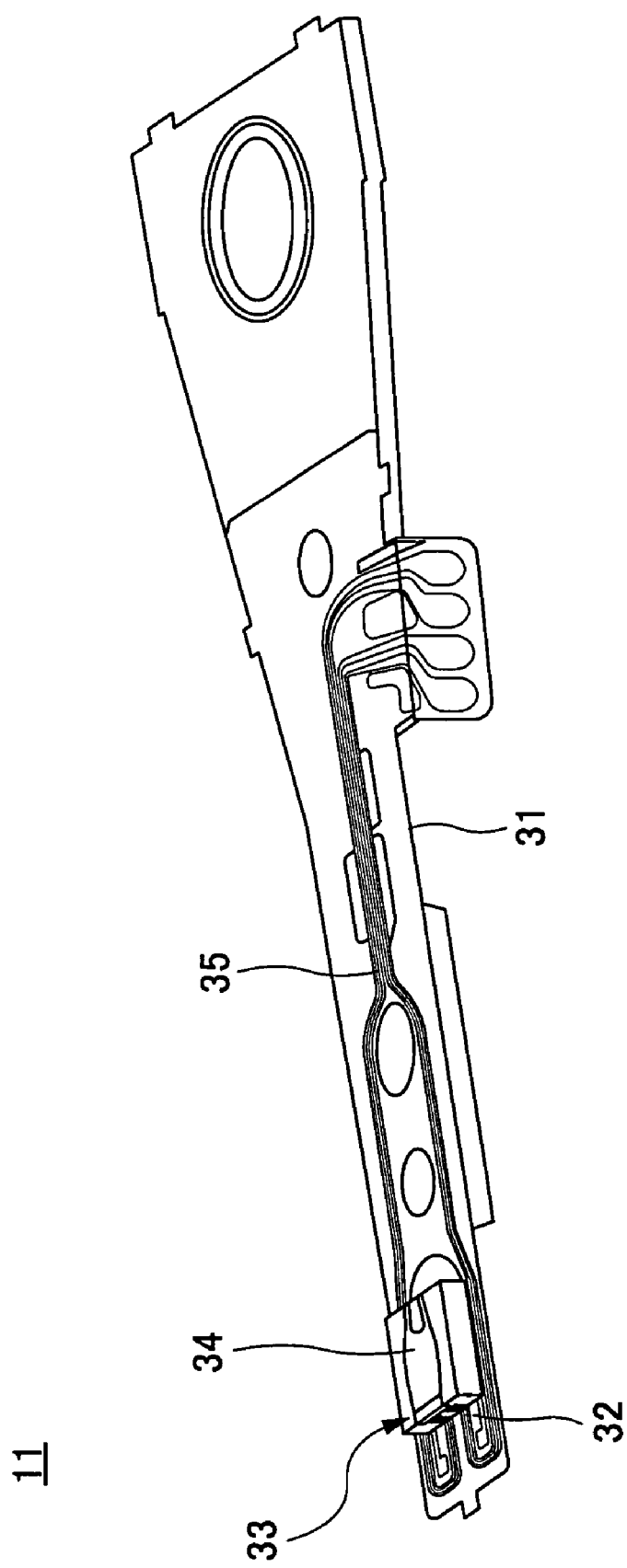
FIG. 2 is a perspective view of a magnetic head according to the first embodiment of the present invention.
Figure 3:
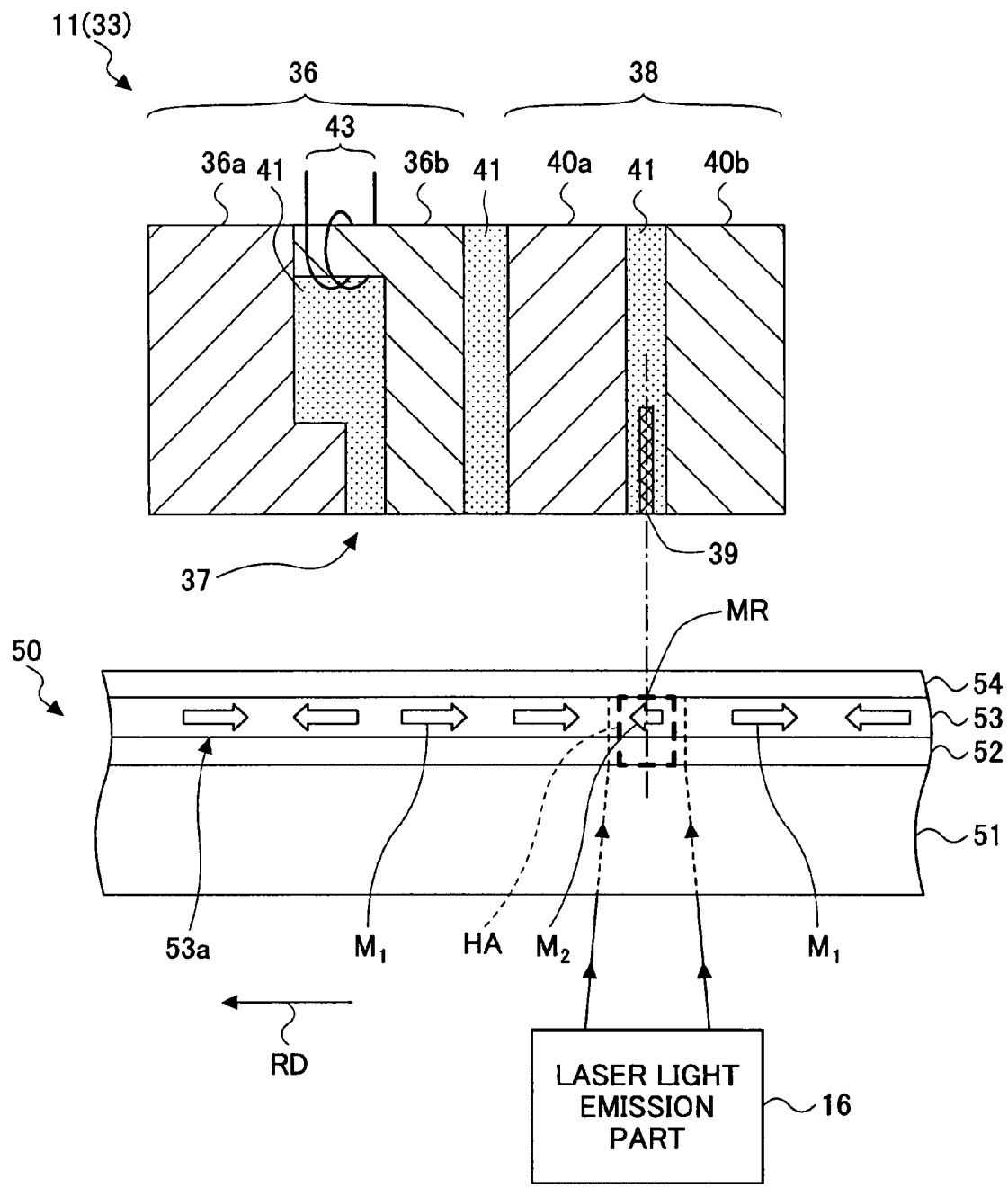
FIG. 3 is a diagram for illustrating a method of evaluating a magnetic recording medium according to the first embodiment of the present invention.

FIG. 2 is a perspective view of the magnetic head 11 according to this embodiment. Referring to FIG. 2 together with FIG. 1, the magnetic head 11 includes a suspension 31 formed of a plate-like metal material, gimbals 32 engaged with the end part of the suspension 31, and a head slider 34 fixed to the gimbals 32. The head slider 34 has an element part 33 including a recording element 36 and a reproduction element 38 (which are so fine as to be not graphically illustrated in FIG. 2, and are shown in FIG. 3). Further, signal interconnection lines 35 that connect the recording element 36 and the reproduction element 38 to the recording and reproduction control part 19 so as to have recording and reproduction signals transmitted therethrough are provided on the suspension 31.

The suspension 31 has its base fixed to the positioning mechanism 14 of the evaluation apparatus 10. The head slider 34 flies over the magnetic recording medium 50 with a predetermined flying height because of the air bearing generated by the rotation of the magnetic recording medium 50 between the medium-opposing surface of the head slider 34 and the surface of the magnetic recording medium 50. A further description is given below of the magnetic head 11.

The magnetic head 11 is not always required to fly over the magnetic recording medium 50. The magnetic head 11 may also be fixed above the magnetic recording medium 50 at such a distance therefrom as to enable recording. As a result, it is possible to prevent heat from a heated recording layer to be conducted to the magnetic head 11, so that the recording and reproduction characteristics of the recording element 36 and the reproduction element 38 are stabilized. Alternatively, a layer of low thermal conductivity (not graphically illustrated) capable of preventing the temperature of the element part 33 from becoming higher than room temperature by 30 degrees or more may be provided between the magnetic head 11 and the magnetic recording medium 50.

Referring back to FIG. 1, the positioning mechanism 14 supports the magnetic head 11, and controls the radial position of the magnetic head 11 in accordance with instructions from the positioning control part 13.

The position of the magnetic head 11 may be controlled by recording tacking servo information on the magnetic recording medium 50 in advance. The tracking servo information reproduced by the magnetic head 11 is fed to the control operation part 22 through the recording and reproduction control part 19. The control operation part 22 feeds a position error correction signal for the magnetic head to the positioning control part 13 based on the tracking servo information. The positioning control part 13 controls the position of the magnetic head 11 based on the position error correction signal. As a result, the position of the magnetic head 11 can be controlled with high accuracy, so that track positioning can be performed with high position accuracy. Consequently, a more accurate magnetic track reproduction output can be obtained, so that it is possible to perform evaluation with accuracy.

Although not graphically illustrated, the laser light emission part 16 includes a light source such as a semiconductor laser, a condenser lens, a positioning mechanism for determining an exposure position, and a focus servo mechanism. The laser light emission part 16 emits laser light into a spot on the magnetic recording medium 50 based on a laser exposure position control signal and a laser power control signal provided from the emission control part 15.

The emission control part 15 includes an exposure position control part 15a and a laser power control part 15b (FIG. 1). The exposure position control part 15a sets (determines) a laser light exposure position, that is, the position of a laser spot formed on (an underlayer 52 [a recording layer 53] shown in FIG. 3 of) the magnetic recording medium 50. Further, the laser power control part 15b controls laser power within the range of, for example, 0.1 mW to several tens mW.

As shown in FIG. 1, the laser light emission part 16 is disposed on the opposite side of the magnetic recording medium 50 from the magnetic head 11 (the bottom surface side of the magnetic recording medium 50), and emits laser light from the bottom surface side of the magnetic recording medium 50. This makes it possible to emit laser light onto positions on the recording layer 53 (FIG. 3) of the magnetic recording medium 50 which positions oppose corresponding parts of the medium-opposing surface of the magnetic head 11 as described below.

The recording and reproduction control part 19 converts a recording signal of a predetermined recording frequency into a recording current and supplies the recording current to a recording coil 43 (FIG. 3) of the magnetic head 11, and causes the magnetic head 11 to perform recording on the magnetic recording medium 50 based on a command from the control operation part 22. Further, the recording and reproduction control part 19 feeds a reproduced signal obtained by the magnetic head 11 to the reproduction output measurement part 21.

The reproduction output measurement part 21 performs A/D conversion on the reproduced signal by calculating its peak values, and feeds the A/D-converted reproduced signal to the control operation part 22 as digital data (reproduction output data).

The control operation part 22 is, for example, a personal computer. The control operation part 22 records the reproduction output data and corresponding laser light exposure position information in the memory 24. Further, the control operation part 22 calculates output reduction rate described below. Further, the control operation part 22 records the calculation results in the memory 24 such as a RAM, a hard disk unit, or an optical disk unit, and displays the calculation results on the display part 25.

FIG. 3 is a diagram for illustrating a method of evaluating a magnetic recording medium according to the first embodiment. FIG. 3 is a schematic enlarged view of the magnetic head 11, the magnetic recording medium 50, and the laser light emission part 16 shown in FIG. 1.

Referring to FIG. 3 together with FIG. 1, the element part 33 of the magnetic head 11 includes the recording element 36 and the reproduction element 38. The recording element 36 includes an upper magnetic pole 36a and a lower magnetic pole 36b each formed of a soft magnetic material such as a FeCo alloy or a NiFe alloy and a recording gap part 37 formed of an alumina film 41 sandwiched between the upper magnetic pole 36a and the lower magnetic pole 36b. The upper magnetic pole 36a and the lower magnetic pole 36b are magnetically connected through a yoke of a soft magnetic material disposed in the depth direction from the medium-opposing surface. Further, the recording coil 43 is provided so as to wind around the yoke. A recording current is supplied to the recording coil 43, so that a recording magnetic field leaks out (emanates) from or is absorbed into the upper magnetic pole 36a and the lower magnetic pole 36b. As a result, the recording magnetic field is formed near the surface of the recording gap part 37.

The reproduction element 38 includes shield layers 40a and 40b each formed of a soft magnetic material and a magnetoresistive film 39 sandwiched between the shield layers 40a and 40b. The magnetoresistive film 39 serves as a magnetic sensing part. The magnetoresistive film 39 detects a signal magnetic field from the magnetic recording medium 50, and converts the detected signal magnetic field into an electrical signal. The structure of the magnetoresistive film 39 is not limited in particular. For example, the magnetoresistive film 39 is selected from a CIP (Current-In-Plane) or CPP (Current-Perpendicular-to-Plane) spin-valve film and a TMR (ferromagnetic tunneling effect) film. The reproduction element 38 may also be a Hall element. The alumina film 41 is formed in the space between the shield layer 40a and the lower magnetic pole 36b and the space between the shield layers 40a and 40b. Further, although not graphically illustrated, the alumina film 41 is also formed to cover the upper magnetic pole 36a and the lower magnetic pole 36b.

The magnetic recording medium 50 is not limited in particular in configuration as an object of evaluation. For example, the magnetic recording medium 50 is formed by successively stacking the underlayer 52, the recording layer 53, and a protection film 54 on a substrate 51. The magnetic recording medium 50 may be any of, for example, a so-called longitudinal (in-plane) magnetic recording medium whose recording layer 53 has a magnetocrystalline easy axis substantially parallel to the substrate surface, a so-called perpendicular magnetic recording medium whose recording layer 53 has a magnetocrystalline easy axis substantially perpendicular to the substrate surface, and a so-called diagonal recording medium whose recording layer 53 has a magnetocrystalline easy axis angled with respect to the substrate surface. Further, the magnetic recording medium 50 may also be a so-called patterned medium having a large number of recording cells, a so-called nanoparticle medium whose recording layer 53 is formed of fine ferromagnetic particles, a so-called nanohole medium whose recording layer 53 is formed by filling multiple fine vertical holes formed in a non-magnetic material with a ferromagnetic material, or a so-called discrete medium in which one or more grooves and one or more lands are concentrically or spirally formed. Further, the magnetic recording medium 50 may be a magneto-optical recording medium.

Further, according to an evaluation method according to one embodiment of the present invention, not only a magnetic recording medium for thermally assisted magnetic recording but also a magnetic recording medium on which recording is performed without using thermally assisted magnetic recording, that is, without heating, may be evaluated. Accordingly, the magnetic recording medium 50 may be either a magnetic recording medium for thermally assisted magnetic recording or a magnetic recording medium that does not need heating for recording. In the following description, a longitudinal magnetic recording medium is taken as an example of the magnetic recording medium 50.

The substrate 51 is not limited in particular as long as the substrate 51 transmits laser light. Preferably, the substrate 51 is a transparent substrate such as a glass substrate or a resin substrate.

Linear unevenness, or so-called texture, may be formed along a recording direction on the surface of the substrate 51.

Further, an orientation control film (not graphically illustrated) such as a NiP film may be provided on the surface of the substrate 51. In this case, the texture may be formed along a recording direction on either the surface of the substrate 51 or the surface of the orientation control film. The formation of the texture causes the magnetocrystalline easy axis of the recording layer 53 to be oriented in the recording direction, so that the recording layer 53 having uniaxial anisotropy is formed. In the case of providing the orientation control film, laser light is emitted onto the orientation control film, and the recording layer 53 is heated by heat conduction through the underlayer 52.

The underlayer 52 is formed of, for example, Cr or a Cr alloy such as CrMo or CrV. As a result, the underlayer 52 is caused to orient the magnetocrystalline easy axis of the recording layer 53 formed of a Co-based alloy parallel to the substrate surface.

A known ferromagnetic material such as a Co-based alloy may be employed for the recording layer 53. It is preferable, however, that the recording layer 53 be formed of a ferromagnetic material containing Co and Pt, such as CoPt, CoCrPt, or CoCrPt-M (where M is one selected from the group consisting of B, Mo, Nb, Ta, W, and Cu) having large magnetic anisotropy. As a result, the coercive force can be increased by the addition of Pt to the ferromagnetic material of the recording layer 53.

Further, the recording layer 53 may have two magnetic layers each formed of a ferromagnetic material and a non-magnetic coupling layer of Ru having a thickness of, for example, 0.7 nm between the magnetic layers, where the two magnetic layers are antiferromagnetically coupled to each other. The recording layer 53 having such a structure is more preferable because of better thermal stability of residual magnetization.

The recording layer 53 may have a so-called granular structure, or a structure formed of multiple crystal grains of a ferromagnetic material and a non-magnetic material (for example, $SiO_2$) surrounding each crystal grain. It is also preferable in this case that the ferromagnetic material be the one containing Co and Pt as described above in terms of large magnetic anisotropy and good thermal stability. In this case, it is preferable to further form an intermediate layer of Ru or a Ru alloy containing Ru as a principal component between the underlayer 52 and the recording layer 53. This makes it possible to reduce zigzag noise at high recording density, so that it is possible to measure the reproduction output of a finer area, thus increasing the position resolution of reproduction output.

A known material such as a carbon film or hydrogenated carbon may be employed for the protection film 54. Further, although not graphically illustrated, a lubricating layer may be formed on the protection film 54.

Next, a description is given of a method of evaluating a magnetic recording medium according to the first embodiment.

Referring to FIG. 3, at the time of recording a signal on the magnetic recording medium 50, the magnetic recording medium 50 is rotated so that the magnetic head 11 flies over the surface of the magnetic recording medium 50. Then, a recording current of a predetermined frequency and predetermined magnitude is caused to flow through the recording coil 43 of the recording element 36, so that a recording magnetic field is applied to the recording layer 53 near the recording gap part 37 of the magnetic head 11. At this point, if the magnetic recording medium 50 is for thermally assisted magnetic recording, the laser light emission part 16 emits laser light for recording onto a position in the recording layer 53 which position opposes the recording gap part 37. A laser power suitable for the type of the magnetic recording medium 50 is selected. It is preferable that the recording layer 53 be sufficiently magnetized and preferably in the state of saturation recording with the laser power.

In the case of measuring reproduction output, the laser light exposure position (exposed to laser light) is set at a position MR in the recording layer 53, which position MR opposes the magnetoresistive film 39, and the size (diameter) of a laser spot is determined (selected) so that the area to be heated by the laser spot (hereinafter referred to as "heated area HA") is larger than an area where the magnetoresistive film 39 can detect a signal magnetic field from the recording layer 53. According to the evaluation method of the first embodiment, it is preferable that the laser light exposure position be determined so that the center of the laser spot coincides with the position MR opposing the magnetoresistive film 39 in the recording layer 53. Then, a signal magnetic field leaking out from the recording layer 53 is detected with the magnetoresistive film 39 so as to obtain a reproduced signal. In the case of measuring reproduction output without heating, a reproduced signal is obtained the same as described above with laser light emission being OFF, that is, without emission of laser light.

For convenience of description, laser light emission (exposure) for recording may be hereinafter referred to as "recording laser light emission (exposure)" and laser light emission (exposure) for reproduction may be hereinafter referred to as "reproduction laser light emission (exposure)."

Figure 4:
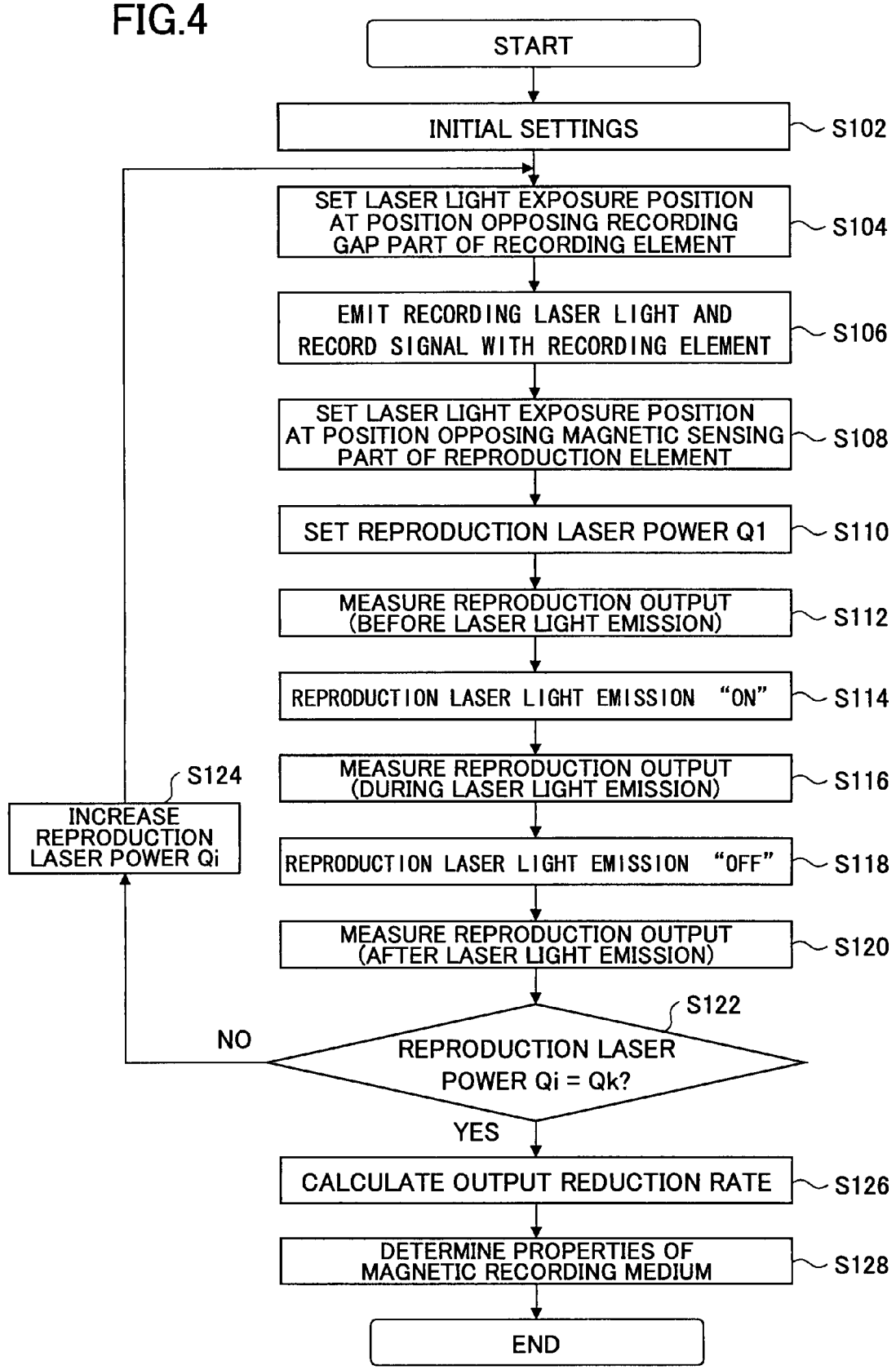
FIG. 4 is a flowchart of the method of evaluating a magnetic recording medium according to the first embodiment of the present invention.
Figure 5:
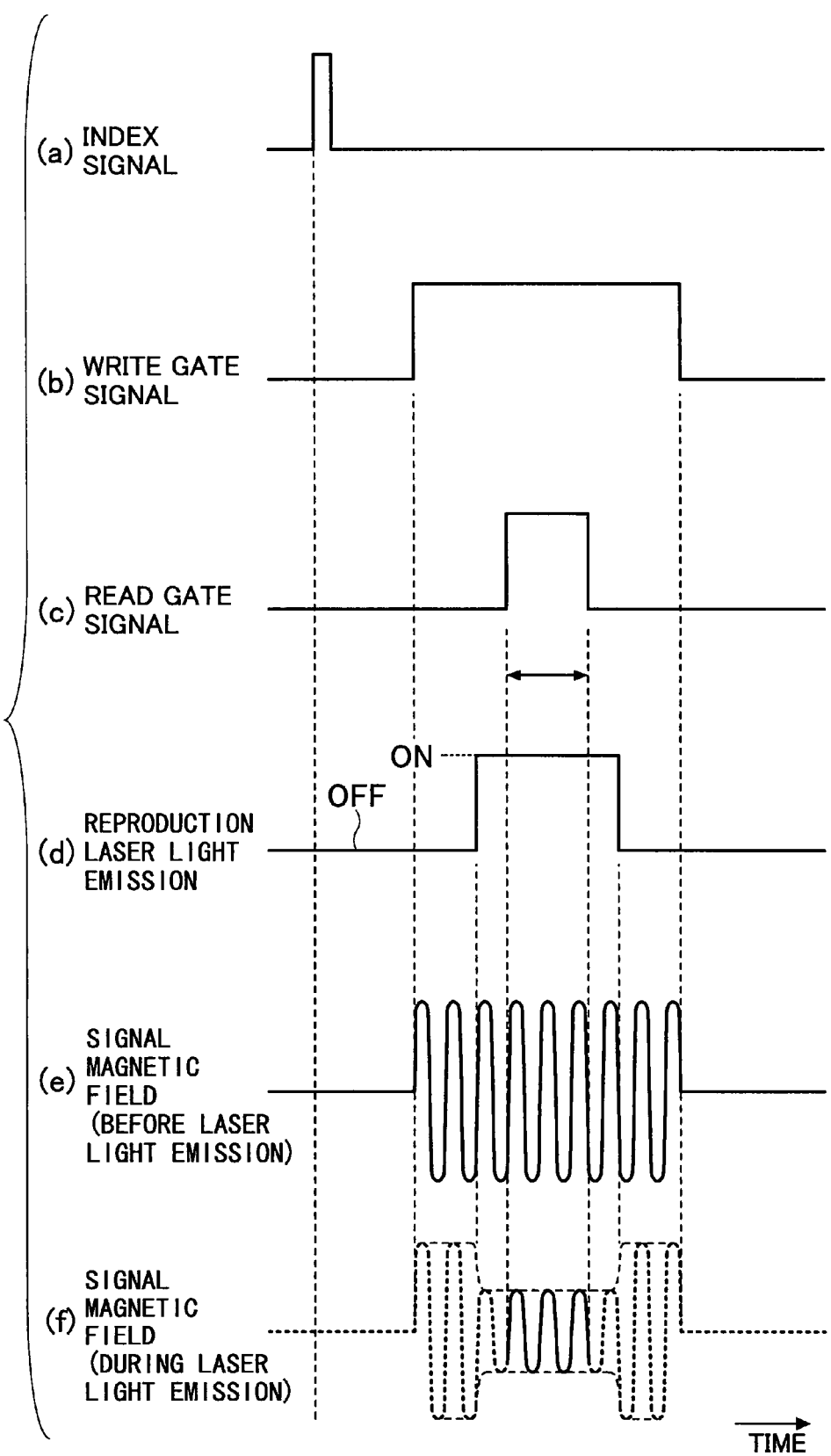
FIG. 5 is a timing chart of the method of evaluating a magnetic recording medium according to the first embodiment of the present invention.

FIG. 4 is a flowchart of the method of evaluating a magnetic recording medium according to the first embodiment. FIG. 5 is a timing chart of the method of evaluating a magnetic recording medium according to the first embodiment.

A description is given, with reference to FIGS. 4 and 5 together with FIGS. 1 and 3, of the method of evaluating a magnetic recording medium according to the first embodiment.

First, in step S102 of FIG. 4, initial settings are provided. In the initial settings, the magnetic recording medium 50 is attached to the evaluation apparatus 10. The magnetic recording medium 50 is rotated at a predetermined rpm so as to cause the magnetic head 11 to fly over the magnetic recording medium 50, and the position of the magnetic head 11 is determined. It is preferable that the magnetic recording medium 50 be demagnetized. If the magnetic recording medium 50 is recorded on, it is preferable to demagnetize the magnetic recording medium 50 with the recording element 36 of the magnetic head 11.

Further, in step S102, a predetermined recording current to be supplied to the magnetic head 11 is determined. A desired recording current value and recording frequency are selected for the recording current. Further, the laser light emission part 16 is positioned so as to emit laser light onto a reference position, for example, the position of the magnetic gap part 37.

The skew angle of the magnetic head 11 is set at, for example, 0°. The skew angle refers to an angle that the recording element longitudinal directions of the recording element 36 of the magnetic head 11 form with the moving direction (recording direction) of the magnetic recording medium 50 in a virtual plane parallel to the substrate surface of the magnetic recording medium 50.

Next, in step S104, the exposure position control part 15a causes the laser light exposure position of the laser light emission part 16 to be set at a position in the recording layer 53 which position opposes the recording gap part 37 of the recording element 36.

Next, in step S106, a preset recording current is supplied to the recording element 36 of the magnetic head 11 so as to record a signal. As a result, a recording magnetic field from the magnetic head 11 is applied to the laser light exposure position so as to magnetize the recording layer 53. Consequently, a magnetic track 53a (FIG. 3) is formed in the recording layer 53, so that a signal magnetic field shown in (e) of FIG. 5 is generated from the recording track 53a. The position at which the magnetic track 53a is formed corresponds to the interval (or section) where a write gate signal shown in (b) of FIG. 5 is HIGH with reference to an index signal shown in (a) of FIG. 5. Within the interval where the write gate signal is HIGH, the write gate of the recording and reproduction control part 19 is open, and a recording magnetic field is applied to the recording layer 53. The index signal is generated from the rotational drive part 18 at a predetermined rotational position once per rotation. Further, the write gate signal is generated in the control operation part 22 in response to the index signal, and fed to the recording and reproduction control part 19. Recording laser light emission may not be performed at the time of signal recording (step S106) if it is possible to sufficiently magnetize the recording layer 53 without emission of (exposure to) recording laser light.

Next, in step S108, the exposure position control part 15a causes the laser light exposure position of the laser light emission part 16 to be set at the position MR opposing the magnetoresistive film 39 of the reproduction element 38 in the recording layer 53. This makes it easy to match the timing of reproduction laser light emission with the timing of the reproduction element 38 reading a reproduced signal. Further, it is also possible to read out a reproduced signal without a time delay with respect to reproduction laser light emission.

Next, in step S110, the reproduction laser power is set at an initial value Q1. The initial value Q1 is the minimum one of the reproduction laser power levels Q1 through Qk employed in this evaluation method, and the reproduction laser power is determined so as to gradually increase from Q1 to Qk.

Next, in step S112, the magnetic track 53a is reproduced with the reproduction element 38 so as to obtain reproduction output before reproduction laser light emission (exposure). Specifically, the signal magnetic field shown in (e) of FIG. 5 is reproduced from the magnetic track 53a with the reproduction element 38. The timing of reproduction coincides with the interval where a read gate signal is HIGH as shown in (c) of FIG. 5. This interval is determined with reference to the index signal, and is set so as to be within the interval where the write gate signal shown in (b) of FIG. 5 is HIGH. As a result, the magnetic track 53a is reproduced. Within the interval where the read gate signal is HIGH, the read gate of the recording and reproduction control part 19 is open. During this interval, a reproduced signal is fed to the reproduction output measurement part 21 through the recording and reproduction control part 19. The reproduction output measurement part 21 determines the average of the amplitudes of the supplied reproduced signal (reproduction output). The obtained reproduction output is fed to the memory 24 through the control operation part 22 to be stored as the reproduction output before reproduction laser light emission (exposure). Steps S108 through S112 do not have to be performed in this order, and may be performed in any order.

Next, in step S114, reproduction laser light emission is started (ON). In step S116, while emitting reproduction laser light onto the magnetic track 53a, the magnetic track 53a is reproduced so as to obtain reproduction output during reproduction laser light emission. At this point, the ON/OFF timing of reproduction laser light emission is determined with reference to the index signal shown in (a) of FIG. 5. The ON interval of reproduction laser light emission is equal to or within the interval where the write gate signal shown in (b) of FIG. 5 is HIGH. For example, as shown in (d) of FIG. 5, the ON timing of reproduction laser light emission is later than the rise of the write gate signal, and the OFF timing of reproduction laser light emission is earlier than the fall of the write gate signal.

The reproduction laser light is emitted into a spot centering on the position MR opposing the magnetoresistive film 39 in the recording layer 53. As a result, the recording layer 53 is heated with the reproduction laser light, so that the intensity of a signal magnetic field from the magnetic track 53a is reduced in the interval where the reproduction laser light is ON as indicated by the broken line and solid line of (f) of FIG. 5. A description is given below of this phenomenon. Since the timing of reproduction coincides with the interval where the read gate signal shown in (c) of FIG. 5 is HIGH, the reproduction output of a reproduced signal during the interval (solid line part) where the signal magnetic field of (f) of FIG. 5 is reduced is obtained. The average of the amplitudes of the reproduced signal of the interval where the read gate signal is HIGH is determined so as to be stored in the memory 24 as the reproduction output during reproduction laser light emission the same as in step S112.

It is preferable that the interval where the read gate signal shown in (c) of FIG. 5 is HIGH be equal to or within the interval where the reproduction laser light emission shown in (d) of FIG. 5 is ON. As a result, it is possible to determine a change in the signal magnetic field due to reproduction laser light emission (exposure) with accuracy.

Next, in step S118, the reproduction laser light emission is stopped (OFF). In step S120, with the temperature having returned to a predetermined temperature, for example, room temperature, the magnetic track 53a is reproduced with the reproduction element 38 so as to obtain reproduction output after reproduction laser light emission. The timing of reproduction is controlled with the read gate signal shown in (c) of FIG. 5. The average of the amplitudes of the reproduced signal is determined so as to be stored in the memory 24 as the reproduction output after reproduction laser light emission the same as in step S112. As described below, when reproduction laser light having laser power greater than a predetermined laser power level is emitted, the reproduction output before reproduction laser light emission may not be restored, so that the reproduction output after reproduction laser light emission may be less than the reproduction output before reproduction laser light emission.

Next, in step S122, it is determined whether the reproduction laser power (current level or value) Qi is the predetermined largest reproduction laser power (level or value) Qk. If the reproduction laser power Qi is not the predetermined largest reproduction laser power Qk (NO in step S122), in step S124, the reproduction laser power Qi is increased by a predetermined amount, and steps S104 through S120 are repeated. Here, every time the reproduction laser power is increased in step S124, signal recording is performed in step S108. This is because using the magnetic track 53a that has received no thermal hysteresis due to reproduction laser light emission makes it possible to perform measurement with the same conditions at each level of the reproduction laser power and thus to prevent measurement variations. Further, the reproduction output before reproduction laser light emission is measured because this can prevent variations in the output of the reproduction element 38 so that it is also possible to prevent measurement variations in this respect.

As many magnetic tracks in different positions as the number of set levels Qi (=k) of the reproduction laser power may be preformed in step S106, and a corresponding unused one of the magnetic tracks may be used at each level Qi of the reproduction laser power. In this case, it is possible to omit signal recording (step S106) performed every time the reproduction laser power is increased (step S124). Here, the magnetic tracks in different positions may be formed at positions radially different from one another or radially the same but in different angular ranges. Alternatively, some of the magnetic tracks may be formed at positions radially different from one another and others may be formed at positions radially the same but in different angular ranges.

If the reproduction laser power Qi is the reproduction laser power Qk (YES in step S122), in step S126, the output reduction rate during laser light emission and the output reduction rate after laser light emission are calculated so as to determine the relationship between the output reduction rate and the reproduction laser power. The output reduction rates are calculated from the reproduction outputs before, during, and after reproduction laser light emission stored in the memory 24, based on the following Eqs. (1) and (2):

$$\text{Output reduction rate(\%) during laser light emission} = \qquad (1)$$
$$(1 - \text{reproduction output during reproduction laser light emission} \div \text{reproduction output before reproduction laser light emission}) \times 100,$$

$$\text{Output reduction rate(\%) after laser light emission} = \qquad (2)$$
$$(1 - \text{reproduction output after reproduction laser light emission} \div \text{reproduction output before reproduction laser light emission}) \times 100.$$

The output reduction rate during laser light emission of Eq. (1) indicates the ratio of reduction in the reproduction output during reproduction laser light emission to the reproduction output before reproduction laser light emission. The output reduction rate after laser light emission of Eq. (2) indicates the ratio of reduction in the reproduction output after reproduction laser light emission to the reproduction output before reproduction laser light emission.

The relationships between the output reduction rate and the reproduction laser power obtained by experiments are shown below.

Figure 6:
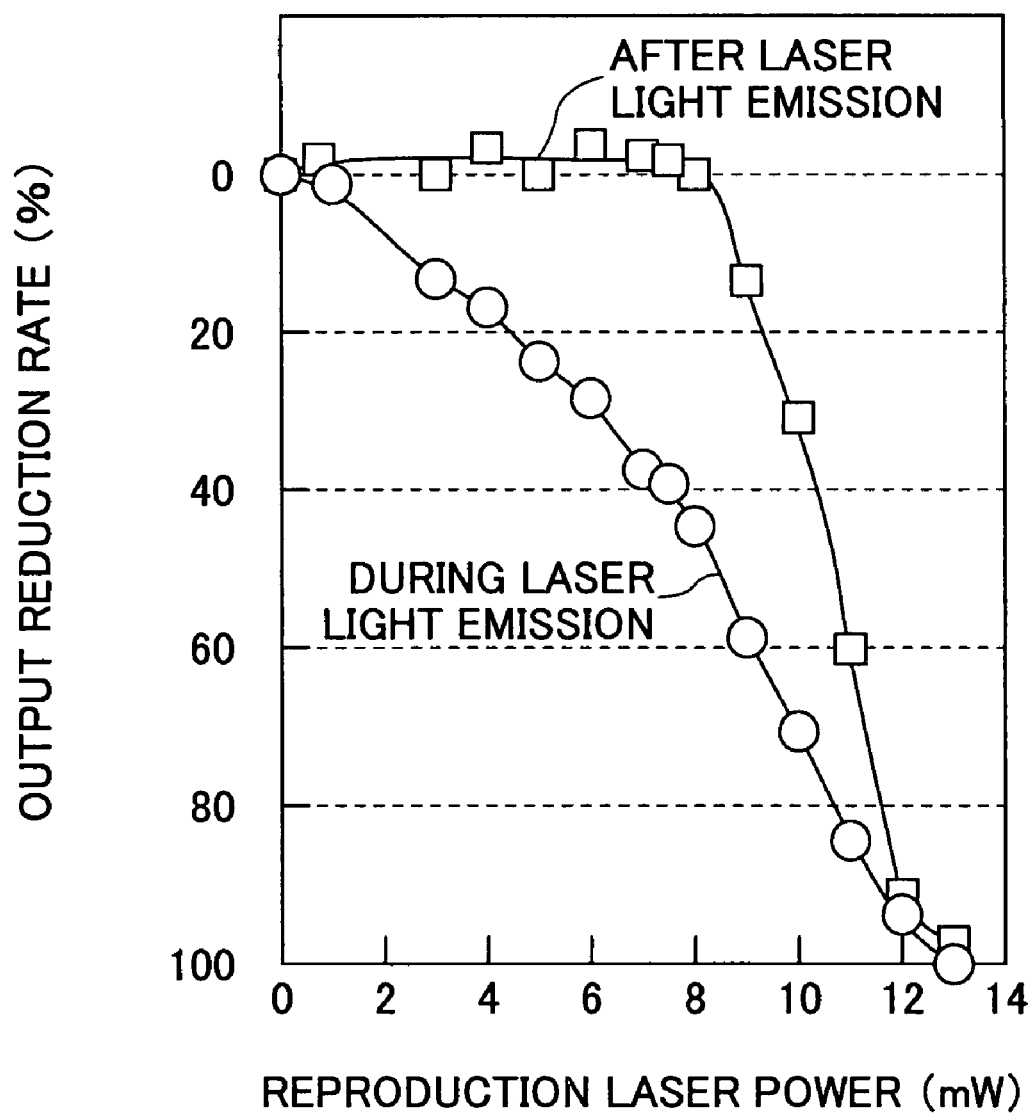
FIG. 6 is a graph showing the relationship between the output reduction rate of a magnetic recording medium and reproduction laser power according to the first embodiment of the present invention.
Figure 7:
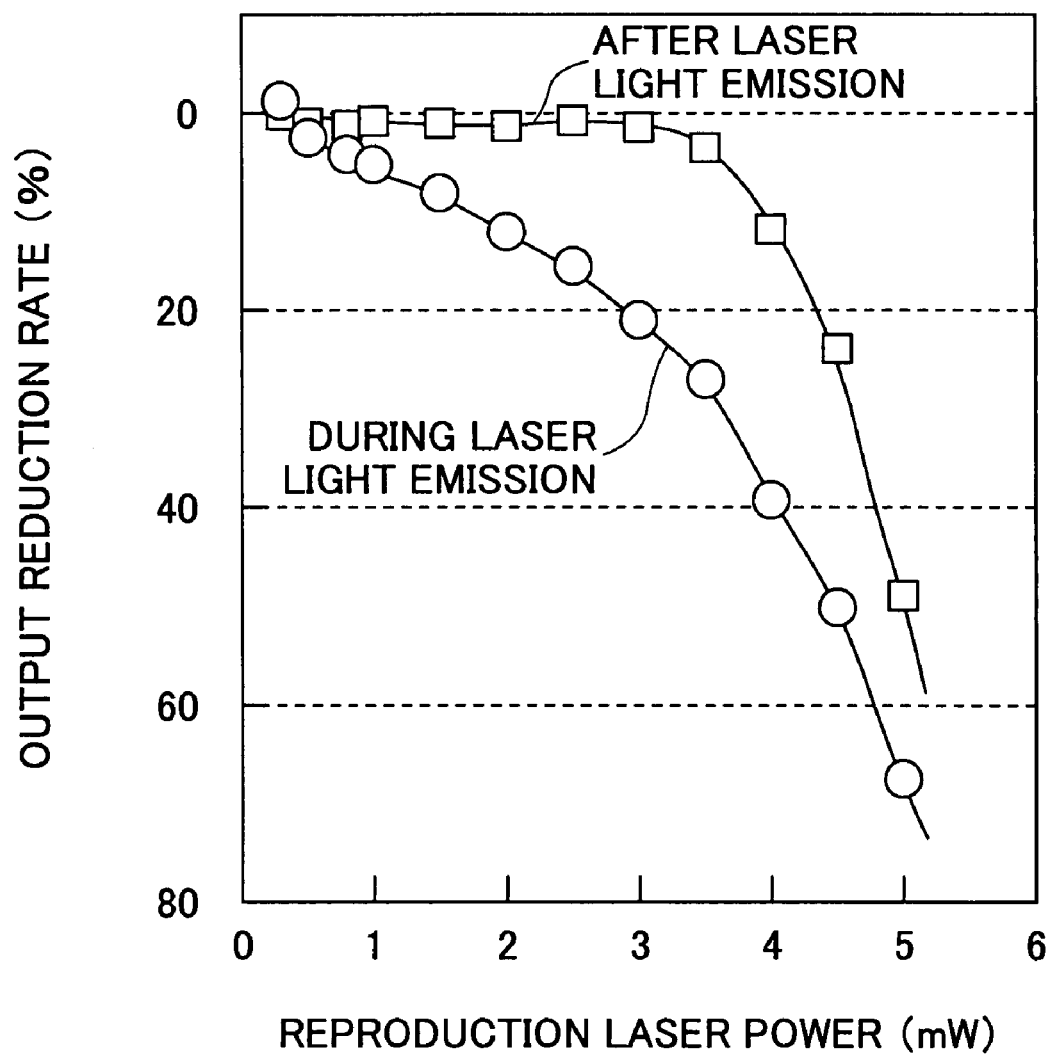
FIG. 7 is a graph showing the relationship between the output reduction rate of another magnetic recording medium and the reproduction laser power according to the first embodiment of the present invention.

FIG. 6 is a graph showing the relationship between the output reduction rate of a magnetic recording medium and the reproduction laser power. FIG. 7 is a graph showing the relationship between the output reduction rate of another magnetic recording medium and the reproduction laser power. In FIGS. 6 and 7, the vertical axis indicates the output reduction rate, which increases toward the bottom on the plane of the paper. This shows that the reproduction output during or after laser light emission is less than before laser light emission. Further, in FIGS. 6 and 7, the horizontal axis indicates the reproduction laser power. Further, in FIGS. 6 and 7, magnetic recording media of high coercive force suitable for thermally assisted magnetic recording (having a recording layer containing a CoCrPt-based alloy) were used. The magnetic recording medium of FIG. 7 has a thinner recording layer and uses a ferromagnetic material containing more Pt than the magnetic recording medium of FIG. 6.

Accordingly, the magnetic recording medium of FIG. 7 has a higher dynamic coercive force than the magnetic recording medium of FIG. 6. Further, a laser head of a 655 nm wavelength and a 0.9 μm spot size was employed for the laser light emission part 16.

Referring to FIG. 6, the output reduction rate during laser light emission gradually increases as the reproduction laser power increases. On the other hand, the output reduction rate after laser light emission remains substantially unchanged at about zero where the reproduction laser power is 0 to 8 mW, and suddenly increases when the reproduction laser power exceeds 8 mW. Both of the output reduction rates during and after laser light emission reach 100% at a reproduction laser power of 13 mW. This shows the following:

(i) Where the reproduction laser power is 0 to 8 mW, the reproduction output during laser light emission is less than the reproduction output before laser light emission, but returns to the reproduction output before laser light emission after the laser light emission is over. That is, there is a reversible change in the magnetization of the recording layer. In FIG. 7, a reversible change occurs where the reproduction laser power is 0 to 3 mW.

(ii) Where the reproduction laser power exceeds 8 mW, the reproduction output after laser light emission is less than the reproduction output before laser light emission, and there is an irreversible change in the magnetization of the recording layer.

Next, in step S128, the properties of the magnetic recording medium are determined based on the relationship between the output reduction rate of the magnetic recording medium and the reproduction laser power. As a result, various properties regarding the magnetic recording medium are obtained. Specifically, as described below, properties of the magnetic recording medium, such as a recording power suitable for a magnetic recording medium for thermally assisted recording and a laser power usable in determination in a test process in designing or manufacturing a magnetic recording medium for thermally assisted recording, are determined from the relationship between the output reduction rate during and/or after laser light emission and the reproduction laser power as follows:

I. A reproduction laser power (level or value) that causes the output reduction rate after laser light emission to be less than or equal to a predetermined output reduction rate, or a reproduction laser power (level or value) lower than such a reproduction laser power is determined as a recording power (level or value) in thermally assisted magnetic recording of a magnetic recording medium. For example, if the predetermined output reduction rate is 0%, the recording power is determined as lower than or equal to 8 mW in FIG. 6 (3 mW in FIG. 7). By thus determining the recording power, it is possible to avoid a problem in that laser light emission at the time of recording in thermally assisted magnetic recording causes reduction in or loss of the amount of magnetization in an area of the recording layer not intended for recording. The above-described predetermined output reduction rate is preferably zero in order to avoid an irreversible decrease in the reproduction output.

II. A reproduction laser power (level or value) that causes the output reduction rate after laser light emission to be a predetermined output reduction rate is determined. If this reproduction laser power is higher than or equal to a predetermined laser power (level or value), the magnetic recording medium is determined as acceptable (non-defective). For example, in FIG. 6, if the reproduction laser power that causes the output reduction rate after laser light emission to be 5% is higher than or equal to 6 mW, the magnetic recording medium is determined as acceptable. By making such determination, it is possible to obtain a magnetic recording medium that is suitable for multiple magnetic storage units of thermally assisted magnetic recording different from each other in the specification of recording power. For example, if one magnetic storage unit employs a recording power of 3 mW and the other magnetic storage unit employs a recording power of 6 mW, it is possible to select a magnetic recording medium suitable for each of the magnetic storage units. In particular, it is preferable that the predetermined output reduction rate be 0%. As a result, it is possible to avoid a problem in that laser light emission at the time of recording in a magnetic storage unit of thermally assisted magnetic recording causes reduction in or loss of the amount of magnetization in an area of the recording layer not intended for recording.

III. The output reduction rate after laser light emission at a predetermined reproduction laser power (level or value) is determined. If this output reduction rate is less than or equal to a predetermined output reduction rate, the magnetic recording medium is determined as acceptable. For example, in FIG. 6, if the output reduction rate after laser light emission at a reproduction laser power of 6 mW is less than or equal to 5%, the magnetic recording medium is determined as acceptable. This determination method can be employed in the case of designing a magnetic recording medium suitable for a magnetic storage unit of thermally assisted magnetic recording for which the recording power is determined, or for selecting a suitable magnetic recording medium in a test process in the process of manufacturing magnetic recording media for such a magnetic storage unit.

IV. The output reduction rate during laser light emission at a predetermined reproduction laser power (level or value) is determined. If this output reduction rate is less than or equal to a predetermined output reduction rate, the magnetic recording medium is determined as acceptable. For example, in FIG. 6, if the output reduction rate during laser light emission at a reproduction laser power of 8 mW is less than or equal to 60%, the magnetic recording medium is determined as acceptable.

The determination method of IV is derived from the following action. Various energies work on the magnetization of a recording layer. Examples of the energies include magnetocrystalline anisotropy energy, exchange coupling energy that acts between magnetizations, and a demagnetizing field. The thermal stability of the magnetization is determined by the magnitudes of these energies. It is inferred that the reproduction output during laser light emission decreases because laser light emission changes the balance of these energies so as to cause an offset in the orientation of the magnetization. From this way of thinking, it is easily understood that the thermal stability is also better with a lower output reduction rate during laser light emission. Accordingly, it is possible to select a magnetic recording medium having good thermal stability by making the output reduction rate during laser light emission be less than or equal to a predetermined value.

V. The output reduction rate during laser light emission at a predetermined laser power (level or value) is determined. If the output reduction rate is greater than or equal to a predetermined output reduction rate, the magnetic recording medium is determined as acceptable. For example, in FIG. 6, if the output reduction rate is greater than or equal to 10% at a reproduction laser power of 3 mW, the magnetic recording medium is determined as acceptable. Further, for example, in FIG. 7, if the output reduction rate is greater than or equal to 5% at a reproduction laser power of 1 mW, the magnetic recording medium is determined as acceptable. An increase in the output reduction rate during laser light emission means that heating by laser light emission causes the magnetization of the recording layer to be properly inclined to the direction of magnetization in the case of no heating. From this, it is concluded that, for example, in the case of perpendicularly applying a magnetic field to the medium surface of a perpendicular recording medium having magnetization oriented perpendicular to the medium surface, laser light emission causes the angle of magnetization with respect to the applied magnetic field for recording to be greater than 0°, so that it is possible to reduce a reversed magnetic field. Accordingly, it is possible to select a magnetic recording medium showing good recording characteristics in thermally assisted magnetic recording by determining that the output reduction rate during laser light emission at a predetermined reproduction laser power is greater than or equal to a predetermined value.

VI. A reproduction laser power (level or value) at which the two curved lines of the output reduction rate during laser light emission and the output reduction rate after laser light emission close (12 mW in FIG. 6) or a reproduction laser power (level or value) at which one of the two curved lines reaches a reduction of 100% (=no remaining output) is determined. This laser power is a characteristic point that clearly indicates the temperature characteristics of a magnetic recording medium. This characteristic point corresponds to a temperature at which the residual magnetization is caused to be zero by a change in temperature in a magnetic property measurement device such as a vibrating sample magnetometer (VSM) or a superconducting quantum interference device (SQUID). By having manufacturing variations in this characteristic point (reproduction laser power) managed to be, for example, within ±5% of a predetermined power level in a magnetic recording medium testing process, it is possible to manage the thermal stability of a magnetic recording medium or the quality of a magnetic recording medium for thermally assisted magnetic recording.

VII. One of the above-described determination methods I through III is combined with one of the above-described determination methods IV through VI. As a result, it is possible to select a magnetic recording medium that is suitable for thermally assisted magnetic recording and has good thermal stability.

As described above, according to the first embodiment, there is provided a method of evaluating a magnetic recording medium capable of evaluating magnetization behavior due to heat in a simple manner by determining the reproduction output during or after emission of (exposure to) laser light for reproduction. In particular, it is possible to evaluate the magnetization behavior due to heat of a magnetic recording medium based on the relationship between the output reduction rate during and/or after laser light emission and the reproduction laser power.

Further, referring to FIG. 1, the laser light emission part 16 is disposed on the opposite side of the magnetic recording medium 50 from the magnetic head 11 in the evaluation apparatus 10. Accordingly, the evaluation apparatus 10 does not require a magnetic head integrated with a laser light emission part. This provides the advantage that the magnetic head 11 can be selected from a wider range.

The laser light emission part 16 may be disposed on the same side as the magnetic head 11 with respect to the magnetic recording medium 50. In this case, it is possible to evaluate a magnetic recording medium having a recording layer on each side of the substrate although the space for disposing the laser light emission part 16 may be restricted or easiness in determining the laser light exposure position may be reduced compared with the case of FIG. 1.

According to the above-described evaluation method, a signal to serve as a position of reference may be recorded on the magnetic recording medium 50 in advance instead of the index signal ([a] of FIG. 5) so as to be used as the reference of a rotational position.

Further, if the magnetic recording medium 50 is not for thermally assisted magnetic recording, the flowchart of FIG. 4 may be carried out without performing the laser light exposure position determination of step S104 and the recording laser light emission of step S106.

Further, if it is possible to evaluate the magnetic recording medium 50 with a single predetermined reproduction laser power level in any of the above-described determination methods, the reproduction laser power is determined in step S110 and steps S122 and S124 are omitted in FIG. 4.

Further, in the above-described determination methods, the output reduction rate is determined by Eq. (1) or (2). Alternatively, the amount of output reduction may be determined instead of the output reduction rate, and the properties of the magnetic recording medium 50 or the recording power may be determined based on the amount of output reduction.

[Second Embodiment]

Figure 8:
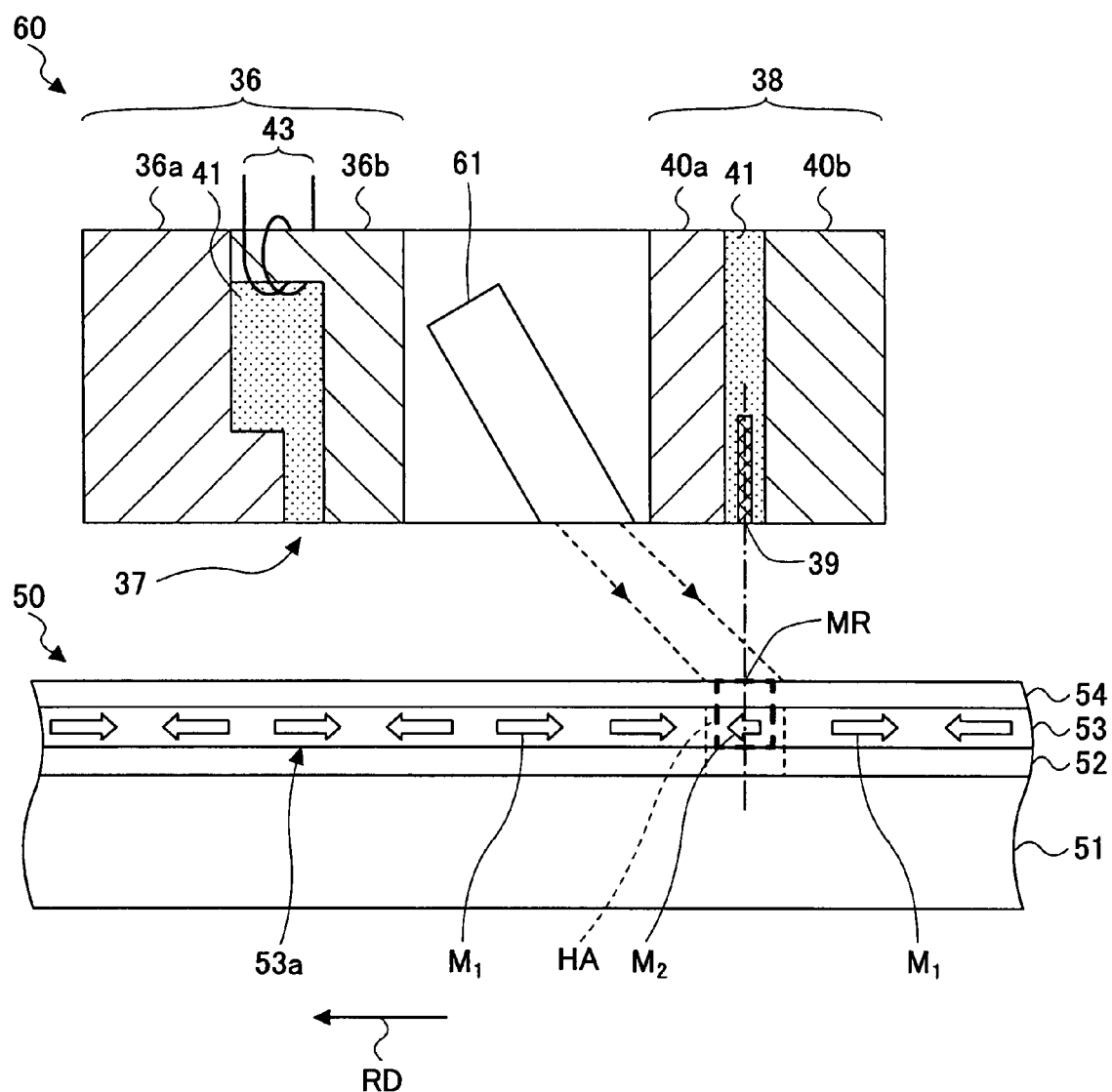
FIG. 8 is a diagram for illustrating a method of evaluating a magnetic recording medium according to a second embodiment of the present invention.

FIG. 8 is a diagram for illustrating a method of evaluating a magnetic recording medium according to a second embodiment of the present invention.

The second embodiment is the same as the first embodiment except that the laser light emission part of an evaluation apparatus is provided in a magnetic head.

Referring to FIG. 8, a magnetic head 60 according to the second embodiment is substantially the same as the magnetic head 11 shown in FIG. 2, but has a laser light emission part 61 provided in the head slider 34. The laser light emission part 61 is, for example, an optical device, and is capable of setting the laser light exposure position at the position MR opposing the magnetoresistive film 39 of the reproduction element 38 in the recording layer 53. Further, the laser light emission part 61 is connected to the emission control part 15 of the first embodiment shown in FIG. 1, and has the same function and can operate in the same manner as the laser light emission part 16. Accordingly, the same operations as in the first embodiment can be performed in the second embodiment.

The evaluation method according to the second embodiment is performed in the same manner as the flowchart of the evaluation method of the first embodiment shown in FIG. 4. Accordingly, the evaluation method according to the second embodiment has the same effects as the evaluation method according to the first embodiment.

Further, according to the evaluation method of the second embodiment, reproduction laser light is emitted from the same side as the magnetic head 60. As a result, it is possible to evaluate a magnetic recording medium having a recording layer formed on each side of the substrate.

[Third Embodiment]

According to an evaluation method of a third embodiment, the reproduction output is measured with different time periods between the start of emission of reproduction laser light and detection of a signal magnetic field, thereby detecting temporal behavior of magnetization due to laser light emission. The evaluation apparatus employed in the evaluation method according to the third embodiment has the same configuration as shown in FIGS. 1 through 3, and a description thereof is omitted.

FIG. 9 is a flowchart of the method of evaluating a magnetic recording medium according to the third embodiment.

A description is given, with reference to FIG. 9 together with FIGS. 1 and 3, of the method of evaluating a magnetic recording medium according to this embodiment.

First, in step S142 of FIG. 9, initial settings are provided the same as in step S102 of FIG. 4.

Next, in step S144, the exposure position control part 15a causes the laser light exposure position of the laser light emission part 16 to be set at a position in the recording layer 53 which position opposes the recording gap part 37 of the recording element 36.

Next, in step S146, a preset recording current is supplied to the recording element 36 of the magnetic head 11 so as to record a signal. As a result, the magnetic track 53a is formed at the laser light exposure position in the recording layer 53. The timing of signal recording is substantially the same as (b) of FIG. 5.

Next, in step S148, the exposure position control part 15a causes the laser light exposure position of the laser light emission part 16 to be set at a predetermined position $L_1$ near the position opposing the magnetoresistive film 39 of the reproduction element 38 in the recording layer 53. The laser light exposure positions $L_1, L_2, \ldots, L_j, \ldots, L_m$ according to this evaluation method are determined as follows.

Figure 10A:
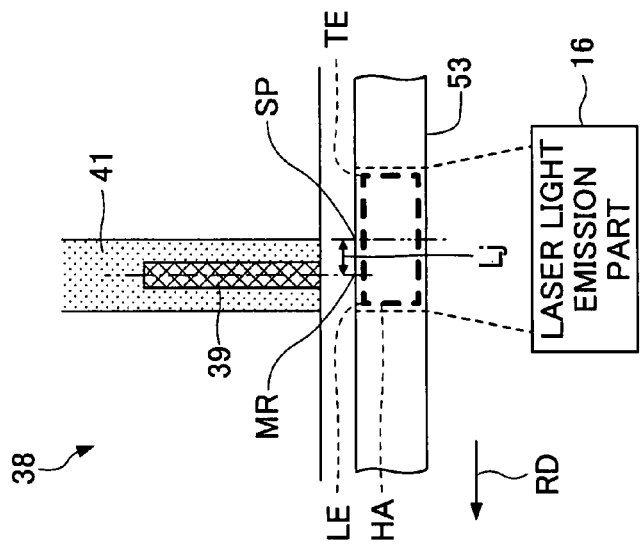
FIGS. 10A through 10C are diagrams for illustrating the relationship between a reproduction laser light exposure position and the position of a magnetoresistive element according to the third embodiment of the present invention.
Figure 10B:
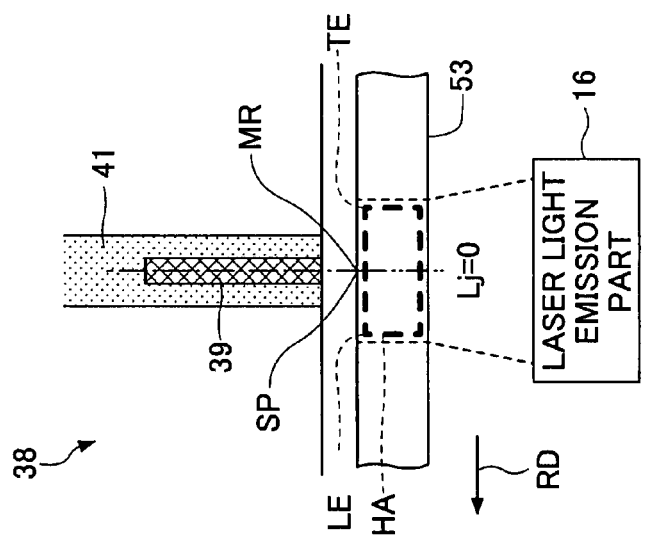
Figure 10C:
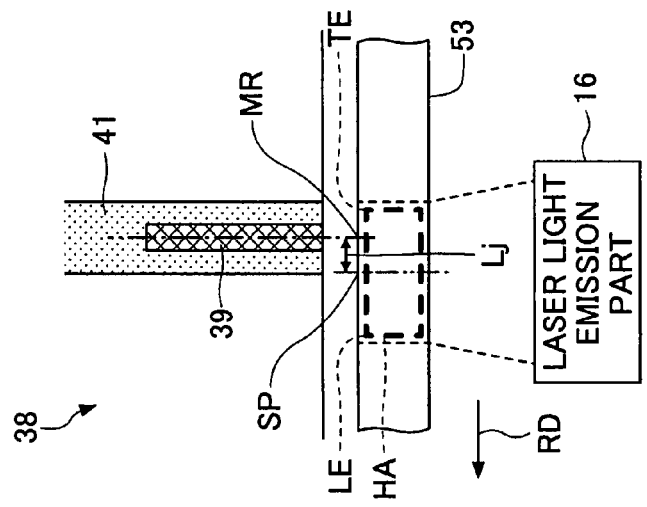

FIGS. 10A through 10C are diagrams for illustrating the relationship between the reproduction laser light exposure position and the position of the magnetoresistive element 39. Each of FIGS. 10A through 10C is a schematic enlarged view of part of FIG. 3. In FIGS. 10A through 10C, only part of the reproduction element 38 of the magnetic head 11, the recording layer 53 of the magnetic recording medium 50, and the laser light exposure part 16 are shown, and a graphical representation of other elements is omitted. Further, in FIGS. 10A through 10C, the recording layer 53 (that is, the magnetic recording medium 50) moves in the direction indicated by arrow RD.

The laser light exposure position Lj is determined so that a trailing end part TE (in the direction RD) of the heated area HA of the recording layer 53 heated by laser light emission slightly overlaps the position MR opposing the magnetoresistive film 39 as shown in FIG. 10A. In this case, the trailing end part TE of the recording layer 53 moves to the position MR opposing the magnetoresistive film 39 in a short period of time after exposure to laser light. Accordingly, it is possible to detect the magnetization behavior of the recording layer 53 immediately after the start of laser light emission.

It is assumed in FIG. 10A that the laser light exposure position Lj is determined so that, for example, the distance between the position MR opposing the magnetoresistive film 39 and the trailing end part TE of the heated area HA is 0.1 μm and that the magnetic recording medium travels at a speed of 7.7 m/s. In this case, the time between the start of heating the trailing end part TE and detection of a signal magnetic field by the magnetoresistive film 39 is 0.1 μm÷7.7 m/s=13 ns. Thus, it is possible to detect the magnetization behavior of the recording layer 53 immediately after the start of heating.

Further, the laser light exposure position Lj is also determined so that the center of the heated area HA of the recording layer 43 heated by laser light emission coincides with the position MR as shown in FIG. 10B. In this case, it is possible to detect the magnetization behavior of the recording layer 53 after passage of an appropriate period of time since the start of laser light emission (the start of heating).

Further, the laser light exposure position Lj is also determined so that a leading end part LE (in the direction RD) of the heated area HA of the recording layer 53 heated by laser light emission slightly overlaps the position MR opposing the magnetoresistive film 39 as shown in FIG. 10C. In this case, it is possible to detect the magnetization behavior of the recording layer 53 after passage of a sufficient period of time since laser light emission. For example, it is assumed that the laser light exposure position Lj is determined so that, for example, the distance between the position MR opposing the magnetoresistive film 39 and the leading end part LE of the heated area HA (0.8 μm in diameter) is 0.1 μm and that the magnetic recording medium travels at a speed of 7.7 m/s. In this case, the time between the start of heating and detection of a signal magnetic field by the magnetoresistive film 39 is (0.8-0.1) μm÷7.7 m/s=91 ns. Thus, it is possible to detect the magnetization behavior of the recording layer 53 after passage of a sufficient period of time since the start of laser light emission (the start of heating).

Thus, it is preferable that the laser light exposure position Lj be determined so as to cover the cases of FIGS. 10A through 10C. However, part of the cases of FIGS. 10A through 10C may be omitted in accordance with the purpose of evaluation. The laser light exposure position Lj may also be shifted further rightward on the plane of the paper from the position shown on FIG. 10A so that the position MR opposing the magnetoresistive film 39 is excluded from the heated area HA.

Referring back to FIG. 9, in step S150, the reproduction laser power is set at an initial value Q1. The initial value Q1 is the minimum one of the reproduction laser power levels Q1 through Qk employed in this evaluation method, and the reproduction laser power is determined so as to gradually increase from Q1 to Qk.

Next, in step S151, the magnetic track 53a is reproduced with the reproduction element 38 so as to obtain reproduction output before reproduction laser light emission (exposure).

Next, in step S152, reproduction laser light emission is started (ON). In step S154, while emitting reproduction laser light onto the magnetic track 53a, the magnetic track 53a is reproduced so as to obtain reproduction output during reproduction laser light emission. At this point, the ON/OFF timing of reproduction laser light emission is determined with reference to the index signal shown in (a) of FIG. 5. The ON interval of reproduction laser light emission is equal to or within the interval where the write gate signal shown in (b) of FIG. 5 is HIGH. For example, as shown in (d) of FIG. 5, the ON timing of reproduction laser light emission is later than the rise of the write gate signal, and the OFF timing of reproduction laser light emission is earlier than the fall of the write gate signal.

Further, the read gate signal is caused to rise at the same time the reproduction laser light emission is started ("ON"). As a result, it is possible to measure reproduction output with accuracy. In particular, it is possible to faithfully measure the reproduction output in the case of the laser light exposure position Lj shown in FIG. 10A. The average of the amplitudes of a reproduced signal is determined so as to be stored in the memory 24 as the reproduction output during reproduction laser light emission the same as in step S112.

Next, in step S155, the reproduction laser light emission is stopped (OFF).

Next, in step S156, it is determined whether the reproduction laser power (current level) Qi is the largest reproduction laser power (level or value) Qk. If the reproduction laser power Qi is not the largest reproduction laser power Qk (NO in step S156), in step S158, the reproduction laser power Qi is increased by a predetermined amount, and steps S146 through S155 are repeated. Here, every time the reproduction laser power is increased in step S158, signal recording is performed in step S146 for the same reasons as in the first embodiment shown in FIG. 4.

If the reproduction laser power Qi is the largest reproduction laser power Qk (YES in step S156), in step S160, it is determined whether the reproduction laser light exposure position Lj is Lm. If the reproduction laser light exposure position Lj is not Lm (NO in step S160), in step S162, the reproduction laser light exposure position Lj is offset to a predetermined position.

Next, in step S164, the already recorded magnetic tack 53a is erased. The magnetic track 53a is erased by AC erasure or DC erasure with the magnetic head 11. At this point, the magnetic track 53a (recording layer 53) may be exposed to laser light so as to increase the temperature of the recording layer 53 so that the magnetic track 53a is erased by the magnetic head 11 with a lower magnetic field.

Next, steps S144 through S158 are repeated. If the reproduction laser light exposure position Lj is Lm (YES in step S160), in step S172, the relationship among the reproduction output, the reproduction laser light exposure position, and the reproduction laser power is obtained. The curves showing this relationship, that is, the relationship between the reproduction output and the reproduction laser light exposure position (at predetermined reproduction laser power levels), are hereinafter referred to as "heating response curves."

Figure 11:
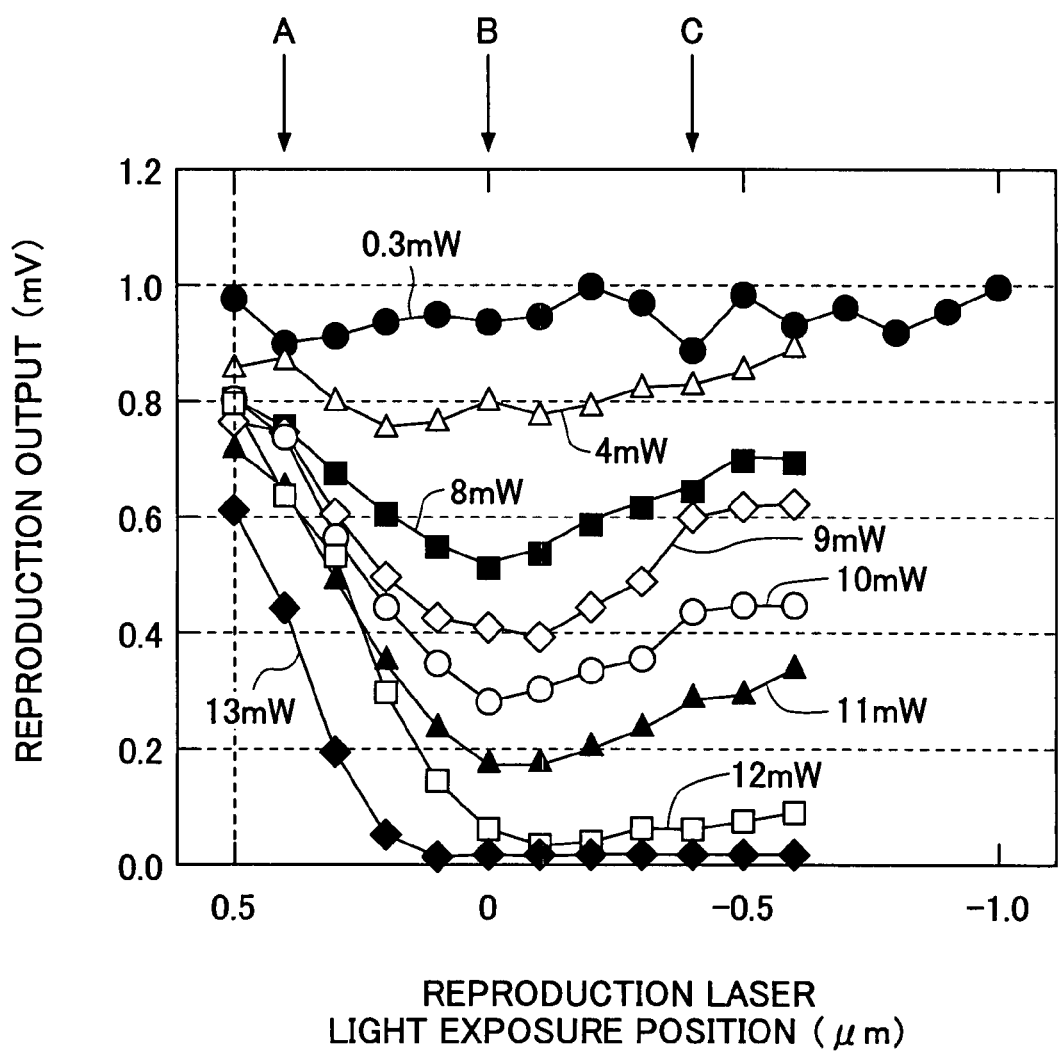
FIG. 11 is a graph showing the relationship among the reproduction output of a magnetic recording medium during reproduction laser light emission, the reproduction laser light exposure position, and laser power according to the third embodiment of the present invention.
Figure 12:
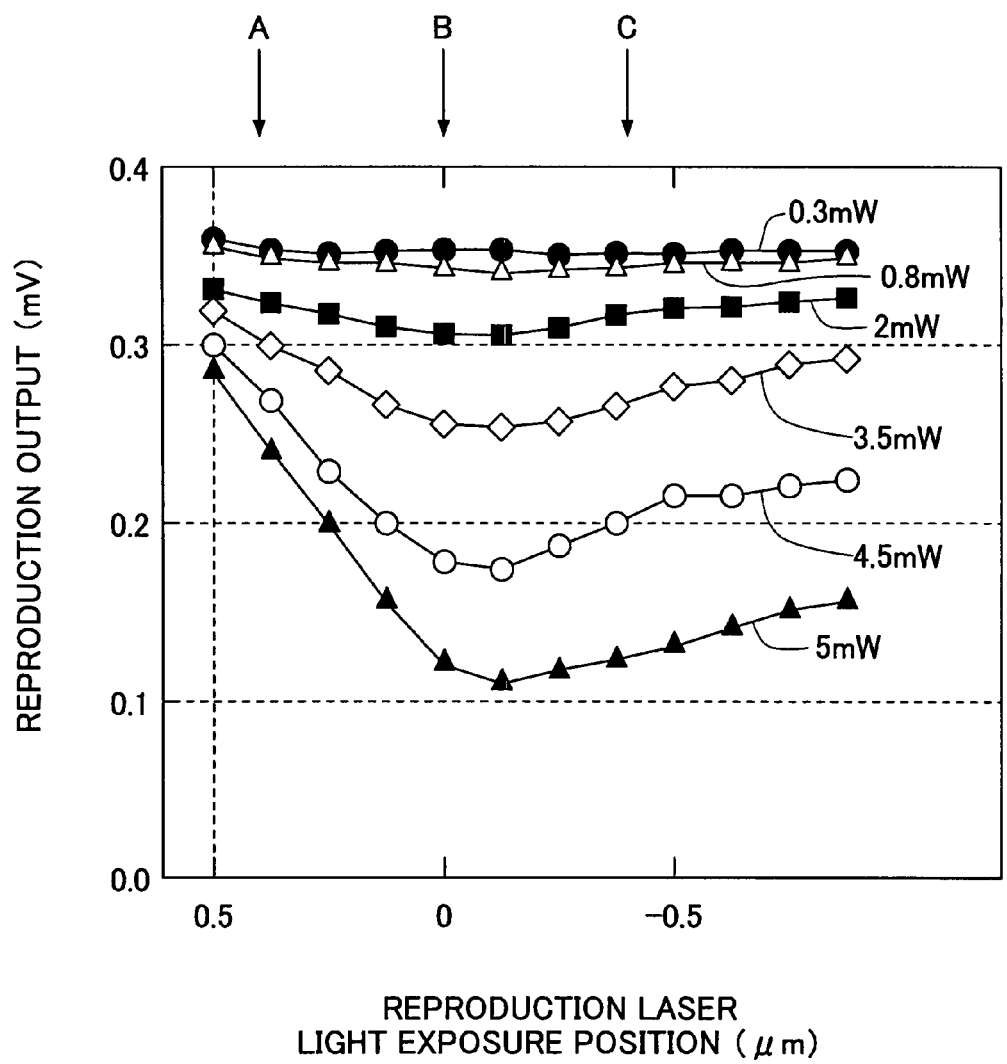
FIG. 12 is a graph showing the relationship among the reproduction output of another magnetic recording medium during reproduction laser light emission, the reproduction laser light exposure position, and the laser power according to the third embodiment of the present invention.

FIG. 11 is a graph showing the relationship among the reproduction output of a magnetic recording medium during reproduction laser light emission, the reproduction laser light exposure position, and the laser power. FIG. 12 is a graph showing the average reproduction output of another magnetic recording medium during reproduction laser light emission, the reproduction laser light exposure position, and the laser power. In FIGS. 11 and 12, the vertical axis represents reproduction output, and the horizontal axis represents the distance between the position MR opposing the magnetoresistive film 39 and the center of the heated area HA (the reproduction laser light exposure position Lj). If the center of the heated area HA is on the downstream side of the magnetoresistive film 39 in the traveling direction RD of the magnetic recording medium (for example, as the disposition of FIG. 10A), the distance is indicated with "+." If the center of the heated area HA is on the upstream side of the magnetoresistive film 39 in the traveling direction RD of the magnetic recording medium (for example, as the disposition of FIG. 10C), the distance is indicated with "−." Further, the laser light exposure positions corresponding to the dispositions of FIGS. 10A, 10B, and 10C are shown as Positions A, B, and C, respectively, in FIGS. 11 and 12. Further, the magnetic recording media of FIGS. 11 and 12 are the same as those of FIGS. 6 and 7, respectively. The same laser head as in FIGS. 6 and 7 was employed as the laser light emission part 16 in FIGS. 11 and 12.

Referring to FIGS. 11 and 12, the heating response curves show that the reproduction output tends to decrease over reproduction laser light exposure positions of 0.5 μm to 0 μm (from Position A to Position B) and to slightly increase from the reproduction laser light exposure position of 0 μm to a reproduction laser light exposure position of −0.6 μm (from Position B to Position C).

Here, in the case of a "+" side position (for example, Position A), it is possible to observe the magnetization behavior immediately after the start of reproduction laser light emission as described above. In the magnetic recording medium shown in FIG. 11 (hereinafter through the description of FIG. 13, referred to as "first medium"), the reproduction output decreases over the reproduction laser light exposure positions of 0.5 μm to 0 μm at reproduction laser light powers of 8 mW or higher. In particular, at 13 mW, the reproduction output sharply decreases at the reproduction laser light exposure position of 0.5 μm compared with the case of 12 mW. This shows that the magnetization swings away from the direction of magnetization before emission immediately after the start of heating.

On the other hand, in the magnetic recording medium shown in FIG. 12 (hereinafter through the description of FIG. 13, referred to as "second medium"), the tendency of the heating response curves with respect to the reproduction laser light exposure position is substantially the same as that of FIG. 11. However, FIG. 12 shows that in the second medium, the magnetization swings away from the direction of magnetization before emission at the reproduction laser light exposure position of 0.5 μm, that is, immediately after the start of heating, at reproduction laser light powers of 4 mW or higher.

Referring back to FIG. 9, in step S172, the properties of the magnetic recording medium are determined. Here, step S172 includes determination of the quality of the magnetic recording medium.

Figure 13:
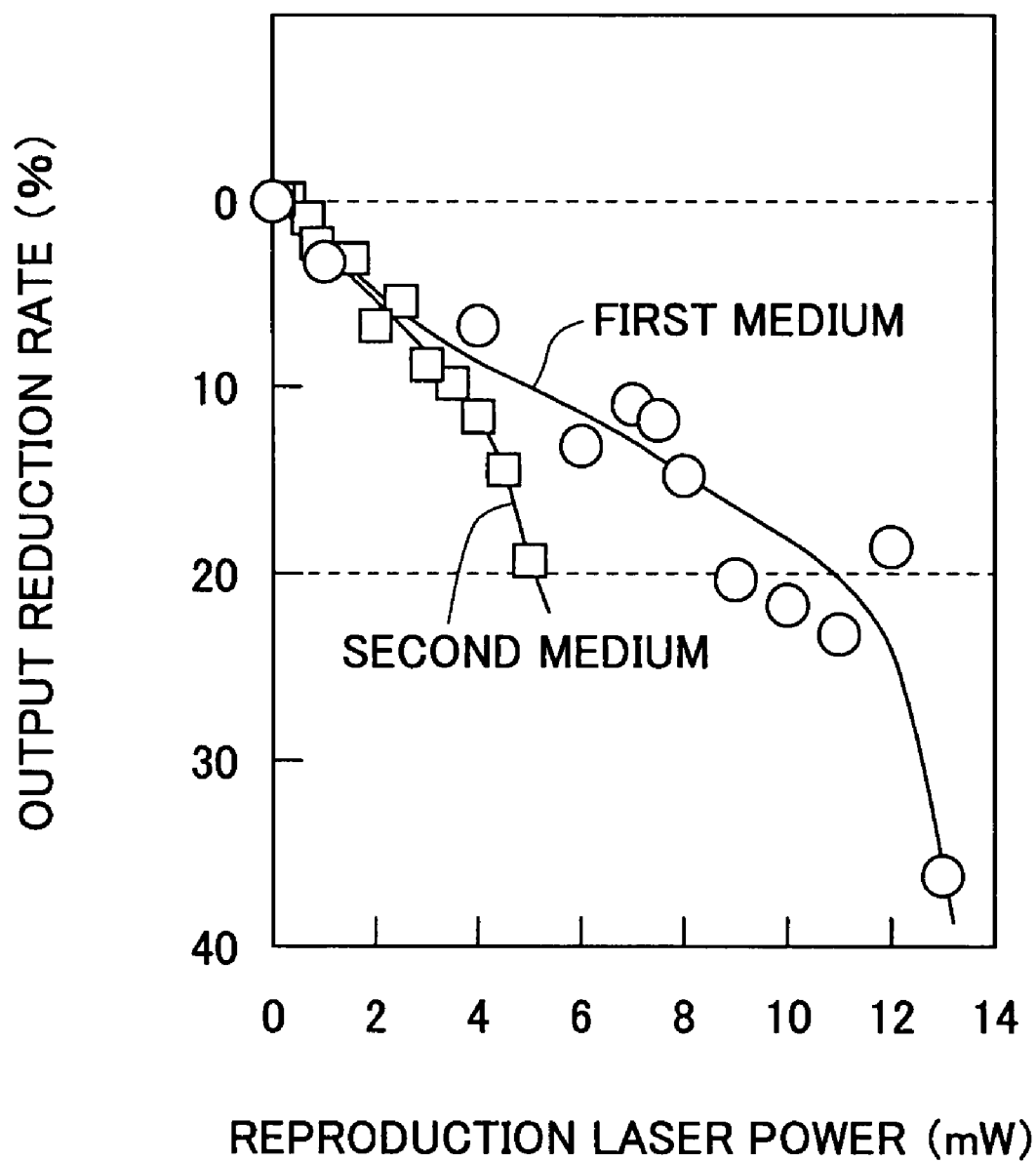
FIG. 13 is a graph showing the relationship between an output reduction rate immediately after the start of reproduction laser light emission and the reproduction laser power according to the third embodiment of the present invention.

FIG. 13 is a graph showing the relationship between the output reduction rate immediately after the start of reproduction laser light emission and the reproduction laser power. The relationship is determined by Eq. (1) described above, using the reproduction outputs at the reproduction laser light exposure position of 0.5 μm in FIGS. 11 and 12 and the reproduction outputs before reproduction laser light emission.

The data points of FIG. 13 include the heating response curves of reproduction laser power that are not graphically represented in FIGS. 11 and 12. This is because a graphical representation of some heating response curves is properly omitted for simplification in FIGS. 11 and 12.

Referring to FIG. 13, in the first medium, after gradually decreasing with respect to the reproduction laser light power, the output reduction rate sharply decreases at 12 mW to 13 mW, while in the second medium, the output reduction rate starts to sharply decrease from 4 mW. It is easily inferred from this that the second medium is greater in heat fluctuation due to heating than the first medium. The relationship shown in FIG. 13 does not show the first and second media after being heated for a relatively long period of time so as to receive thermal hysteresis, but shows the behavior of residual magnetization immediately after the start of heating. Therefore, it is possible to accurately detect the behavior of residual magnetization in the case where the first medium and the second medium are heated.

As described above, according to the method of evaluating a magnetic recording medium according to the third embodiment, the laser light exposure positions $L_1, L_2, \ldots, L_j, \ldots,$ Lm in reproduction laser light emission are set at positions displaced from the position opposing the magnetic sensing part of the reproduction element, and the reproduction output during reproduction laser light emission is measured, thereby determining the output reduction rate of the reproduction output during reproduction laser light emission with respect to the reproduction output before reproduction laser light emission. Accordingly, it is possible to detect the residual magnetization behavior of the recording layer not after being heated for a relatively long period of time, but immediately after the start of heating, that is, after passage of an extremely short period of time on the order of 10 ns as described above. According to this evaluation method, since evaluation can be performed irrespective of laser spot size, it is possible to use a currently available laser head for the laser light emission part. Further, the evaluation method is simple. Accordingly, it is possible to perform evaluation with a simple method. Further, by obtaining the relationship between the output reduction rate immediately after the start of reproduction laser light exposure and the reproduction laser power, it is possible to evaluate in detail a thermal effect exerted on residual magnetization when the recording layer of a magnetic recording medium containing a recorded signal is heated.

According to the method of evaluating a magnetic recording medium according to the third embodiment, the flowchart shown in FIG. 9 may be carried out with a predetermined single reproduction laser power level. In this case, steps S156 and S158 of FIG. 9 are omitted.

According to the method of evaluating a magnetic recording medium according to the third embodiment, the "ON" timing of reproduction laser light emission is simultaneous with the rise timing of the read gate signal. Alternatively, the read gate signal may rise earlier than the start ("ON" timing) of reproduction laser light emission as described below.

Figure 14:
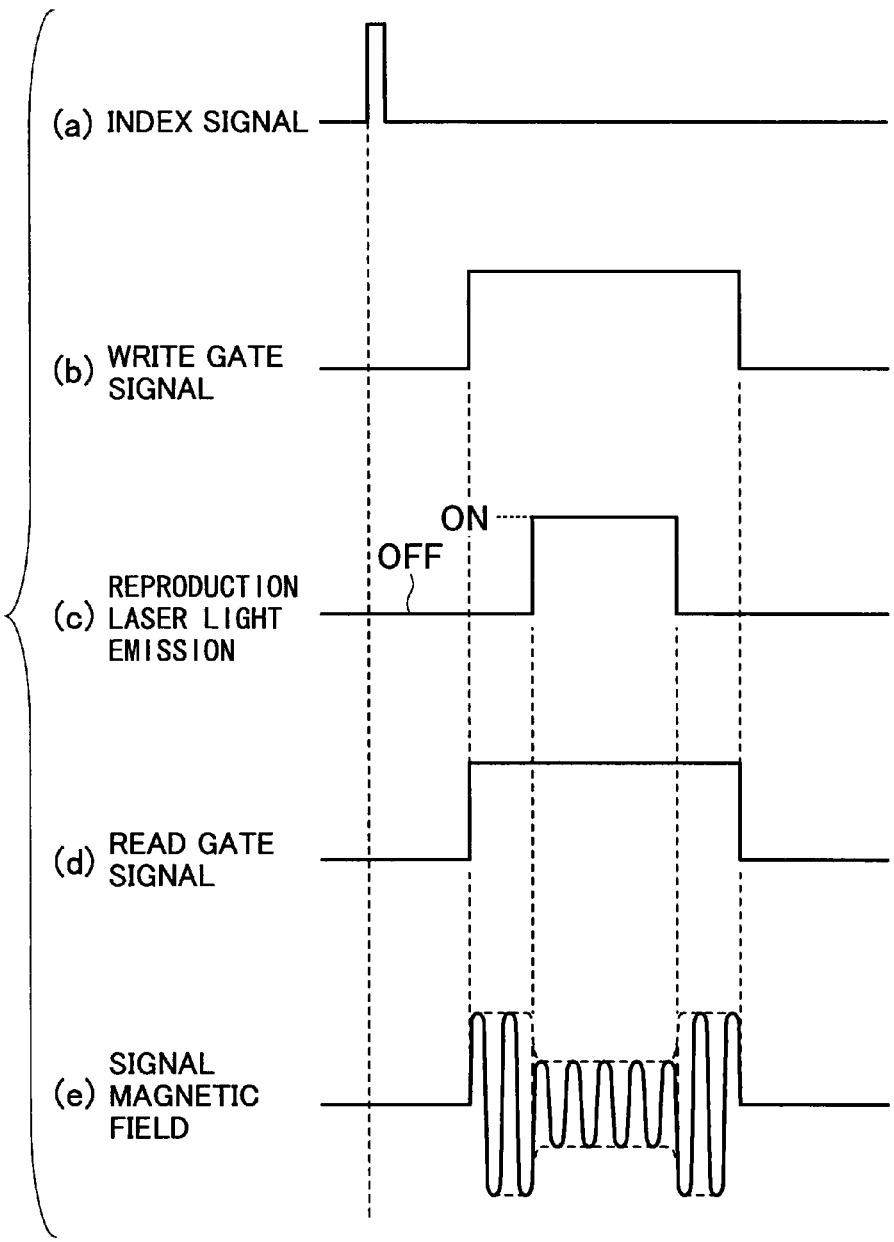
FIG. 14 is a timing chart of a method of evaluating a magnetic recording medium according to a variation of the third embodiment of the present invention.

FIG. 14 is a timing chart of a method of evaluating a magnetic recording medium according to a variation of the third embodiment of the present invention.

Referring to FIG. 14, the read gate signal of (c) of FIG. 14 is caused to rise before the reproduction laser light emission is "ON." As a result, as shown in the signal magnetic field of (e) of FIG. 14, the signal magnetic field decreases and increases in accordance with "ON" and "OFF" of the laser light emission. These changes over time in the signal magnetic field can be detected as changes over time in the reproduction output. It is inferred that the amounts of these changes and the inclinations of the decrease and increase are related to the thermal stability of the residual magnetization of a magnetic recording medium. Accordingly, the thermal stability of residual magnetization may be evaluated with this evaluation method.

[Fourth Embodiment]

According to the evaluation methods of the first through third embodiments, the magnetic recording medium 50 and the magnetic head 11 or 60 are moved relative to each other so as to detect a signal magnetic field. According to an evaluation method of a fourth embodiment, evaluation is performed with the magnetic recording medium 50 and the magnetic head 11 being held stationary.

An evaluation apparatus used in the evaluation method according to the fourth embodiment is substantially the same as the evaluation apparatus 10 shown in FIG. 1. In the evaluation apparatus 10 shown in FIG. 1, the magnetic recording medium 50 is rotated at high speed. Meanwhile, in this embodiment, signal recording is performed with the recording element 36 while rotating the magnetic recording medium 50 or holding the magnetic recording medium 50 stationary, and reproduction is performed with the magnetic recording medium 50 being held stationary. Further, the recording element 36 and the reproduction element 38 are disposed so that a recording track formed in the recording layer 53 by signal recording can be reproduced with the reproduction element 38.

Figure 15:
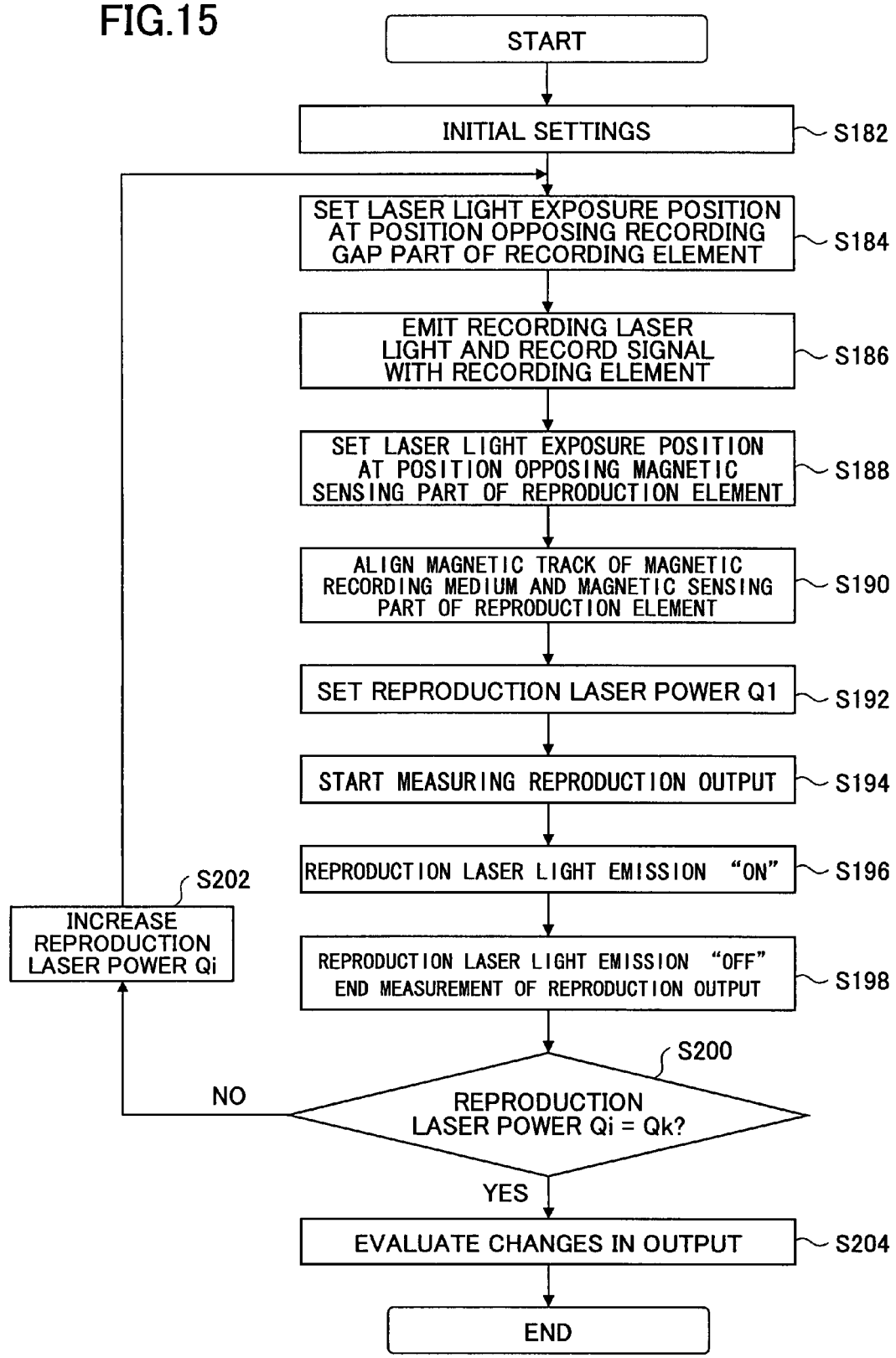
FIG. 15 is a flowchart of a method of evaluating a magnetic recording medium according to a fourth embodiment of the present invention.

FIG. 15 is a flowchart of the method of evaluating a magnetic recording medium according to the fourth embodiment of the present invention.

The evaluation method according to the fourth embodiment is substantially the same as the evaluation method according to the first embodiment except for at the time of measuring reproduction output. Accordingly, a description thereof is given with reference to FIGS. 1 and 3 in addition to FIG. 15.

First, in step S182, initial settings are provided. Next, in step S184, the exposure position control part 15a causes the laser light exposure position of the laser light emission part 16 to be set at a position in the recording layer 53 which position opposes the recording gap part 37 of the recording element 36. Then, in step S186, signal recording is performed. These steps are performed in the same manner as steps S102 through S106 of FIG. 4 of the first embodiment.

Next, in step S188, the exposure position control part 15a causes the laser light exposure position of the laser light emission part 16 to be set at the position MR opposing the magnetoresistive film 39 of the reproduction element 38 in the recording layer 53.

Next, in step S190, the rotation of the magnetic recording medium 50 is stopped, and the magnetic track 53a and the magnetoresistive film 39 (magnetic sensing part) of the reproduction element 38 are aligned.

Next, in step S192, the reproduction laser power is set at an initial value Q1. The initial value Q1 is the minimum one of the reproduction laser power levels Q1 through Qk employed in this evaluation method, and the reproduction laser power is determined so as to gradually increase from Q1 to Qk.

Next, in step S112, the magnetic track 53a is reproduced with the reproduction element 38 so as to obtain reproduction output before reproduction laser light emission (exposure).

Next, in step S194, measurement of reproduction output is started. Specifically, the read gate signal is switched to HIGH. Then, in step S196, reproduction laser light emission is started (ON). Next, in step S198, the reproduction laser light emission is stopped (OFF) after a predetermined period of time, and the measurement ends. As a result, the same changes as in the signal magnetic field shown in (e) of FIG. 14 are caused, so that changes over time in the reproduction output are stored in the memory 24.

Next, in step S200, it is determined whether the reproduction laser power (current level) Qi is the predetermined largest reproduction laser power (level or value) Qk. If the reproduction laser power Qi is not the predetermined largest reproduction laser power Qk (NO in step S200), in step S202, the reproduction laser power Qi is increased by a predetermined amount, and steps S184 through S198 are repeated. Here, every time the reproduction laser power is increased in step S202, signal recording is performed in step S186 for the same reasons as in the first embodiment shown in FIG. 4.

If the reproduction laser power Qi is the predetermined largest reproduction laser power Qk (YES in step S200), in step S204, the reproduction output stored in the memory 24 is evaluated. The reproduction output changes over time, and the amounts of changes in the reproduction output and the inclinations of an increase and decrease in the reproduction output are evaluated the same as in the above-described variation of the third embodiment.

As described above, according to the evaluation method of the fourth embodiment, the thermal stability of residual magnetization may be evaluated by measuring changes in reproduction output due to emission of (exposure to) laser light. Further, according to the evaluation method of the fourth embodiment, the reproduction output is measured with the magnetic recording medium 50 and the reproduction element being held stationary relative to each other. Accordingly, it is possible to detect changes in the reproduction output with ease.

[Fifth Embodiment]

A method of manufacturing a magnetic recording medium according to a fifth embodiment of the present invention applies, to its process of testing the magnetic recording medium, one of the methods of evaluating a magnetic recording medium according to the above-described first through fourth embodiments.

FIG. 16 is a flowchart of the method of manufacturing a magnetic recording medium according to the fifth embodiment.

Referring to FIG. 16, the manufacturing process of the magnetic recording medium includes the process of cleaning the surface of a substrate (cleaning process) (step S302), the process of forming films such as an underlayer, a recording layer, and a protection film as described above in the first embodiment on the substrate (thin film formation process) (step S304), the process of applying lubricant on the protection film as required (lubricating layer formation process) (step S306), the process of checking projections on or defects of the surface of the magnetic recording medium (surface test process) (step S308), and the process of testing the recording and reproduction characteristics of the magnetic recording medium and evaluating the magnetic recording medium according to one of the first through fourth embodiments (test process) (step S310). The above-described cleaning process, thin film formation process, lubricating layer formation process, and surface test process are not limited in particular, and known processes may be applied thereto. Accordingly, a description thereof is omitted.

In the test process, selection of magnetic recording media is performed according to, for example, the evaluation method of the first embodiment. Specifically, one of the determination methods of I through VII described in the first embodiment is employed in this selection. It is also possible to use any of the evaluation methods of the second through fourth embodiments. However, since the magnetic recording medium usually has a recording layer on each side of the substrate, the laser light emission part 16 should be disposed on the same side as the reproduction element 38 with respect to the magnetic recording medium.

According to the method of manufacturing a magnetic recording medium of the fifth embodiment, it is possible to determine the quality of a magnetic recording medium in terms of magnetization behavior due to heat. In particular, it is possible to determine whether the thermal stability of the residual magnetization of a magnetic recording medium is good and to determine the quality of a magnetic recording medium for thermally assisted magnetic recording. Accordingly, it is possible to manufacture a magnetic recording medium in which residual magnetization has good thermal stability and a magnetic recording medium for thermally assisted magnetic recording having predetermined quality.

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) determining a second value of the reproduction output by emitting an energy line having a power of a predetermined value onto the predetermined area and reproducing the predetermined area with the reproduction element during or after the emission of the energy line; and (d) calculating a change in the reproduction output due to the emission of the energy line based on the first value and the second value of the reproduction output.

According to one embodiment of the present invention, an energy line is emitted onto a predetermined area of the recording layer of a magnetic recording medium in which area a signal is recorded. The reproduction output from the predetermined area before the emission of the energy line and the reproduction output from the predetermined area during or after the emission of the energy line are obtained with a reproduction element. A change in the reproduction output during or after the emission with respect to the reproduction output before the emission is obtained. Thereby, the magnetic behavior due to heat of the recording layer heated by exposure to the energy line can be evaluated in a simple manner. Here, examples of the energy line include laser light and an electromagnetic wave.

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) determining a second value of the reproduction output by reproducing the predetermined area with the reproduction element while emitting an energy line having a power of a predetermined value onto the predetermined area; (d) calculating an output reduction rate during the emission of the energy line with respect to the reproduction output before the emission of the energy line based on the first value and the second value of the reproduction output; and (e) determining a property of the magnetic recording medium based on the output reduction rate during the emission of the energy line.

According to one embodiment of the present invention, an energy line is emitted onto a predetermined area of the recording layer of a magnetic recording medium in which area a signal is recorded. The reproduction output from the predetermined area before the emission of the energy line and the reproduction output from the predetermined area during the emission of the energy line are obtained with a reproduction element. The properties of the magnetic recording medium are determined based on the output reduction rate of (the rate of reduction in) the reproduction output during the emission with respect to the reproduction output before the emission. Thereby, the magnetic behavior due to heat of the recording layer heated by exposure to the energy line can be evaluated in a simple manner.

According to one aspect of the present invention, there is provided a method of evaluating a magnetic recording medium using a magnetic head having a reproduction element, the method including the steps of (a) recording a signal in a predetermined area of the magnetic recording medium; (b) determining a first value of a reproduction output by reproducing the predetermined area of the magnetic recording medium; (c) emitting an energy line having a power of a predetermined value onto the predetermined area, and determining a second value of the reproduction output by reproducing the predetermined area with the reproduction element after the emission of the energy line; (d) calculating an output reduction rate after the emission of the energy line with respect to the reproduction output before the emission of the energy line based on the first value and the second value of the reproduction output; and (e) determining a property of the magnetic recording medium based on the output reduction rate after the emission of the energy line.

According to one embodiment of the present invention, an energy line is emitted onto a predetermined area of the recording layer of a magnetic recording medium in which area a signal is recorded. The reproduction output from the predetermined area before the emission of the energy line and the reproduction output from the predetermined area after the emission of the energy line are obtained with a reproduction element. The properties of the magnetic recording medium are determined based on the output reduction rate of (the rate of reduction in) the reproduction output after the emission with respect to the reproduction output before the emission. Thereby, the magnetic behavior due to heat of the recording layer heated by exposure to the energy line can be evaluated in a simple manner.

According to one aspect of the present invention, there is provided a method of evaluating a magnetic recording medium using a magnetic head having a reproduction element, the method including the steps of (a) recording a signal in a predetermined area of the magnetic recording medium; (b) setting an exposure position to be exposed to an energy line at a predetermined position with respect to a magnetic sensing part position in a recording layer of the magnetic recording medium, the magnetic sensing part position opposing a magnetic sensing part of the reproduction element, emitting the energy line having a power of a predetermined value, and determining a reproduction output by reproducing the predetermined area of the recording layer in which the signal is recorded with the reproduction element during the emission of the energy line; (c) changing the exposure position and repeating steps (a) and (b); and (d) determining a property of the magnetic recording medium based on a relationship between the reproduction outputs and the exposure positions.

According to one embodiment of the present invention, the energy line exposure position is set at a position displaced from a magnetic sensing part position opposing the magnetic sensing part of a reproduction element, and the reproduction output during the emission of an energy line is measured, thereby determining the output reduction rate of the reproduction output during the emission of the energy line with respect to the reproduction output before the emission of the energy line. Accordingly, it is possible to detect the residual magnetization behavior of a recording layer not after being heated for a relatively long period of time, but immediately after the start of heating, that is, after passage of an extremely short period of time on the order of 10 ns. According to this evaluation method, since evaluation can be performed irrespective of laser spot size, and the evaluation method is simple, it is possible to detect the behavior of residual magnetization immediately after the start of heating in a simple manner.

According to one aspect of the present invention, there is provided an apparatus for evaluating a magnetic recording medium having a recording layer, the apparatus including a magnetic head having a reproduction element configured to detect a signal magnetic field with a magnetic sensing part; a positioning part configured to position the magnetic head; a heating part configured to heat the recording layer in which a signal is recorded by emitting an energy line onto the recording layer, the heating part being capable of determining a position to be heated; a reproduction part configured to obtain a reproduced signal by detecting the signal magnetic field from the recording layer with the magnetic sensing part with a part of the recording layer opposing the magnetic sensing part being heated to a predetermined temperature with the heating part, and to determine a reproduction output from the reproduced signal; and an operation part configured to determine a property of the magnetic recording medium based on the reproduction output, wherein the reproduction part determines the reproduction output with or after a part of the recording layer opposing the magnetic sensing part being heated to a predetermined temperature with the heating part, and the operation part determines the property of the magnetic recording medium based on a change in the reproduction output.

According to one embodiment of the present invention, it is possible to provide an evaluation apparatus capable of performing any of the above-described methods of evaluating a magnetic recording medium.

According to one aspect of the present invention, there is provided a method of manufacturing a magnetic recording medium, the method including the step of testing the magnetic recording medium, wherein the step of testing determines a property of the magnetic recording medium by any of the above-described evaluation methods, and determines quality of the magnetic recording medium based on the property.

According to one embodiment of the present invention, it is possible to determine the quality of a magnetic recording medium in terms of magnetic behavior due to heat. In particular, it is possible to determine whether the thermal stability of the residual magnetization of a magnetic recording medium is good and to determine the quality of a magnetic recording medium for thermally assisted magnetic recording. Accordingly, it is possible to manufacture a magnetic recording medium in which residual magnetization has good thermal stability and a magnetic recording medium for thermally assisted magnetic recording having predetermined quality.

Thus, according to embodiments of the present invention, it is possible to provide a method and apparatus for evaluating a magnetic recording medium and a method of manufacturing a magnetic recording medium that are capable of evaluating magnetization behavior due to heat in a simple manner.

The present invention is not limited to the specifically disclosed embodiments, and variations and modifications may be made without departing from the scope of the present invention.

For example, although laser light is employed as means for heating a magnetic recording medium in the above description, it is also possible to employ light other than the laser light or an energy line such as an electromagnetic wave. However, such an energy line is required to be as high in energy density and response speed as the laser light. Further, in the case of emitting the energy line from the bottom side of the substrate onto the recording layer through the substrate, a wavelength and intensity that do not adversely affect the reproduction element should be selected for the energy line. Further, a material that transmits the energy line is employed for the substrate.

Further, signal recording is performed and/or a reproduced signal is obtained by rotating the magnetic recording medium 50 in the first through fifth embodiments. Alternatively, signal recording may be performed and/or a reproduced signal may be obtained by linearly moving the magnetic recording medium 50 by placing the magnetic recording medium 50 on a stage that operates in a linear manner.

What is claimed is:

1. A method of evaluating a magnetic recording medium using a magnetic head having a reproduction element, the method comprising:
   (a) recording a signal in a predetermined area of the magnetic recording medium;
   (b) determining a first value of a reproduction output by magnetically reproducing the predetermined area of the magnetic recording medium without energy line emission;
   (c) determining a second value of the reproduction output by emitting an energy line having a power of a predetermined value onto the predetermined area and reproducing the predetermined area with the reproduction element during or after the emission of the energy line;
   (d) calculating an output reduction rate during or after the emission of the energy line with respect to the reproduction output before the emission of the energy line based on the first value and the second value of the reproduction output; and (e) determining a property of the magnetic recording medium based on the calculated output reduction rate with respect to the reproduction output.

2. The method as claimed in claim 1, wherein:
a plurality of values different from each other are set for the power of the energy line, and the second value of the reproduction output is determined for each of the values of the power by performing said (a), (b), and (c) with respect to each of the values of the power before said (d), and
said (d) calculates the output reduction rate with respect to the reproduction output before the emission of the energy line based on the first value and the second value of the reproduction output with respect to each of the values of the power, thereby determining a relationship between the output reduction rates with respect to the reproduction output and the power.

3. The method as claimed in claim 2, wherein the values of the power of the energy line are determined so that the power of the energy line gradually increases.

4. The method as claimed in claim 1, wherein said (a) emits another energy line onto the predetermined area in recording the signal with a recording element.

5. A method of evaluating a magnetic recording medium using a magnetic head having a reproduction element, the method comprising:
(a) recording a signal in a predetermined area of the magnetic recording medium;
(b) determining a first value of a reproduction output by magnetically reproducing the predetermined area of the magnetic recording medium without energy line emission;
(c) determining a second value of the reproduction output by reproducing the predetermined area with the reproduction element while emitting an energy line having a power of a predetermined value onto the predetermined area;
(d) calculating an output reduction rate during the emission of the energy line with respect to the reproduction output before the emission of the energy line based on the first value and the second value of the reproduction output; and
(e) determining a property of the magnetic recording medium based on the output reduction rate during the emission of the energy line.

6. The method as claimed in claim 5, wherein said (e) determines the magnetic recording medium as having good thermal stability so as to be acceptable if the calculated output reduction rate during the emission of the energy line at the power of the predetermined value is less than or equal to a predetermined output reduction rate.

7. The method as claimed in claim 5, wherein said (e) determines the magnetic recording medium as acceptable for thermally assisted magnetic recording if the calculated output reduction rate during the emission of the energy line at the power of the predetermined level is greater than or equal to a predetermined output reduction rate.

8. The method as claimed in claim 5, further comprising:
(f) determining a third value of the reproduction output by reproducing the predetermined area with the reproduction element after the emission of the energy line between said (c) and (d),
wherein said (d) calculates an output reduction rate after the emission of the energy line with respect to the reproduction output before the emission of the energy line based on the first value and the third value of the reproduction output, and said (e) determines the property of the magnetic recording medium based on the output reduction rates during and after the emission of the energy line.

9. The method as claimed in claim 5, wherein:
a plurality of values different from each other are set for the power of the energy line, and the second value of the reproduction output is determined for each of the values of the power by performing said (a), (b), and (c) with respect to each of the values of the power before said (d),
said (d) calculates the output reduction rate during the emission of the energy line based on the first value and the second value of the reproduction output with respect to each of the values of the power, thereby determining a relationship between the output reduction rates during the emission of the energy line and the power, and
said (e) determines the property of the magnetic recording medium based on the relationship between the output reduction rates during the emission of the energy line and the power.

10. The method as claimed in claim 5, further comprising:
(f) determining a third value of the reproduction output by reproducing the predetermined area with the reproduction element after the emission of the energy line between said (c) and (d),
wherein a plurality of values different from each other are set for the power of the energy line, and the second value and the third value of the reproduction output are determined for each of the values of the power by performing said (a), (b), (c), and (f) with respect to each of the values of the power before said (d),
said (d) calculates the output reduction rate during the emission of the energy line based on the first value and the second value of the reproduction output with respect to each of the values of the power, thereby determining a relationship between the output reduction rates during the emission of the energy line and the power; and calculates an output reduction rate after the emission of the energy line based on the first value and the third value of the reproduction output with respect to each of the values of the power, thereby determining a relationship between the output reduction rates after the emission of the energy line and the power, and
said (e) determines the property of the magnetic recording medium based on the relationship between the output reduction rates during the emission of the energy line and the power and the relationship between the output reduction rates after the emission of the energy line and the power.

11. The method as claimed in claim 10, wherein the output reduction rate after the emission of the energy line in said (d) is given by a formula of the output reduction rate (%) after the emission of the energy line=(1−the third value of the reproduction output÷the first value of the reproduction output)×100.

12. The method as claimed in claim 10, wherein said (e) determines a value of the power of the energy line with which the output reduction rate during the emission of the energy line and the output reduction rate after the emission of the energy line coincide with each other at a value greater than 0%.

13. The method as claimed in claim 5, wherein said (a) emits another energy line onto the predetermined area in recording the signal with a recording element.

14. The method as claimed in claim 5, wherein the output reduction rate during the emission of the energy line in said (d) is given by a formula of the output reduction rate (%)

during the emission of the energy line=(1−the second value of the reproduction output the first value of the reproduction output)×100.

15. A method of evaluating a magnetic recording medium using a magnetic head having a reproduction element, the method comprising:
- (a) recording a signal in a predetermined area of the magnetic recording medium;
- (b) determining a first value of a reproduction output by magnetically reproducing the predetermined area of the magnetic recording medium without energy line emission;
- (c) emitting an energy line having a power of a predetermined value onto the predetermined area, and determining a second value of the reproduction output by reproducing the predetermined area with the reproduction element after the emission of the energy line;
- (d) calculating an output reduction rate after the emission of the energy line with respect to the reproduction output before the emission of the energy line based on the first value and the second value of the reproduction output; and
- (e) determining a property of the magnetic recording medium based on the output reduction rate after the emission of the energy line.

16. The method as claimed in claim 15, wherein said (e) determines the magnetic recording medium as having good thermal stability so as to be acceptable if the output reduction rate after the emission of the energy line at the power of the predetermined value is less than or equal to a predetermined output reduction rate.

17. The method as claimed in claim 15, wherein:
a plurality of values different from each other are set for the power of the energy line, and the second value of the reproduction output is determined for each of the values of the power by performing said (a), (b), and (c) with respect to each of the values of the power before said (d),
said (d) calculates the output reduction rate after the emission of the energy line based on the first value and the second value of the reproduction output with respect to each of the values of the power, thereby determining a relationship between the output reduction rates after the emission of the energy line and the power, and
said (e) determines the property of the magnetic recording medium based on the relationship between the output reduction rates after the emission of the energy line and the power.

18. The method as claimed in claim 17, wherein said (e) determines a value of the power of the energy line with which the output reduction rate after the emission of the energy line is less than or equal to a predetermined output reduction rate as a recording power for thermally assisted magnetic recording of the magnetic recording medium.

19. The method as claimed in claim 15, wherein said (a) emits another energy line onto the predetermined area in recording the signal with a recording element.

20. The method as claimed in claim 15, wherein the output reduction rate after the emission of the energy line in said (d) is given by a formula of the output reduction rate (%) after the emission of the energy line=(1−the second value of the reproduction output the first value of the reproduction output)×100.

21. An apparatus for evaluating a magnetic recording medium having a recording layer, the apparatus comprising:
a magnetic head having a reproduction element configured to detect a signal magnetic field with a magnetic sensing part;
a positioning part configured to position the magnetic head;
a heating part configured to heat the recording layer in which a signal is recorded by emitting an energy line onto the recording layer, the heating part being capable of determining a position to be heated;
a reproduction part configured to obtain a reproduced signal by detecting the signal magnetic field from the recording layer, and to determine a reproduction output from the reproduced signal; and
an operation part configured to determine a property of the magnetic recording medium based on the reproduction output,
wherein the reproduction part is configured to determine a first value of the reproduction output by magnetically reproducing a part of the recording layer opposing the magnetic sensing part without energy line emission, and to determine a second value of the reproduction output with or after the part of the recording layer opposing the magnetic sensing part being heated to a predetermined temperature with the heating part, and the operation part is configured to determine the property of the magnetic recording medium based on an output reduction rate during or after the heating with the heating part with respect to the reproduction output before the heating with the heating part based on the first value and the second value of the reproduction output.

* * * * *